US006884291B1

(12) United States Patent
Jikutani et al.

(10) Patent No.: US 6,884,291 B1
(45) Date of Patent: Apr. 26, 2005

(54) LASER DIODE HAVING AN ACTIVE LAYER CONTAINING N AND OPERABLE IN A 0.6 μM WAVELENGTH BAND

(75) Inventors: Naoto Jikutani, Miyagi (JP); Shunichi Sato, Miyagi (JP); Takashi Takahashi, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 09/391,472

(22) Filed: Sep. 8, 1999

Related U.S. Application Data

(63) Continuation-in-part of application No. 09/289,955, filed on Apr. 13, 1999, now Pat. No. 6,563,851.

(30) Foreign Application Priority Data

| | | | |
|---|---|---|---|
| Apr. 13, 1998 | (JP) | ............................................ | 10-117861 |
| Apr. 17, 1998 | (JP) | ............................................ | 10-123990 |
| Apr. 24, 1998 | (JP) | ............................................ | 10-115048 |
| May 21, 1998 | (JP) | ............................................ | 10-156711 |
| Sep. 11, 1998 | (JP) | ............................................ | 10-276569 |
| Nov. 11, 1998 | (JP) | ............................................ | 10-336606 |

(51) Int. Cl.$^7$ ............................................ C30B 25/14
(52) U.S. Cl. .................. 117/89; 117/102; 117/104; 117/105; 117/955; 117/956; 117/953
(58) Field of Search .................. 117/89, 102, 104, 117/105, 955, 956, 953

(56) References Cited

U.S. PATENT DOCUMENTS

| | | | |
|---|---|---|---|
| 4,745,612 A | | 5/1988 | Hayakawa et al. |
| 5,383,211 A | | 1/1995 | Van de Walle et al. |
| 5,585,649 A | | 12/1996 | Ishikawa et al. |
| 5,937,274 A | * | 8/1999 | Kondow et al. ............... 438/47 |
| 6,072,196 A | * | 6/2000 | Sato ............................. 257/87 |
| 6,150,677 A | | 11/2000 | Tanaka et al. |
| 6,281,518 B1 | * | 8/2001 | Sato ............................. 257/13 |

FOREIGN PATENT DOCUMENTS

| | | | |
|---|---|---|---|
| JP | 10-209571 | * | 8/1998 |
| JP | 11-307880 | * | 11/1999 |
| JP | 2000-91710 | * | 3/2000 |

OTHER PUBLICATIONS

Floyd et al. "Hetergeneous integration of visible AlGaInP and . . . " Electronic Letters vol. 35 No. 24 pp 2120–2121, Nov. 25, 1999.*

Ougazzaden et al., "Metal Organic Vapor Phase Epitaxy Growth of GAsN on GaAs Using Dimethylhydrazine and Tertiarybutylarsine," Applied Physics Letters, vol. 70, No. 21, May 26, 1997, pp. 2861–2863.

H. Hamada, et al., "Room–temperature CW Operation of 610nm Band AlGaInP Strained Multiquantum Well Laser Diodes With Multiquantum Barrier".

S. Tiwari et al., "Empirical fit to band discontinuities and barrier heights in III–V alloy systems", Appl. Phys. Lett. 60 (5) Feb. 3, 1992, p. 630–632.

M. Kondow, et al., "GaInNAs: A Novel Material for Long–Wavelength–Range Laser Diodes with Excellent High–Temperature Performance", Jpn. J. Appl. Phys. vol. 35 (1996), p. 1273–1275, Part 1, No. 2B, Feb. 1996.

* cited by examiner

*Primary Examiner*—Robert Kunemund
(74) *Attorney, Agent, or Firm*—Dickstein Shapiro Morin & Oshinsky LLP

(57) ABSTRACT

An optical semiconductor device operable in a 0.6 μm band includes an active layer of GaInNP sandwiched by a pair of GaInP layers each having a thickness of about 2 molecular layers or less.

11 Claims, 24 Drawing Sheets

20 μm

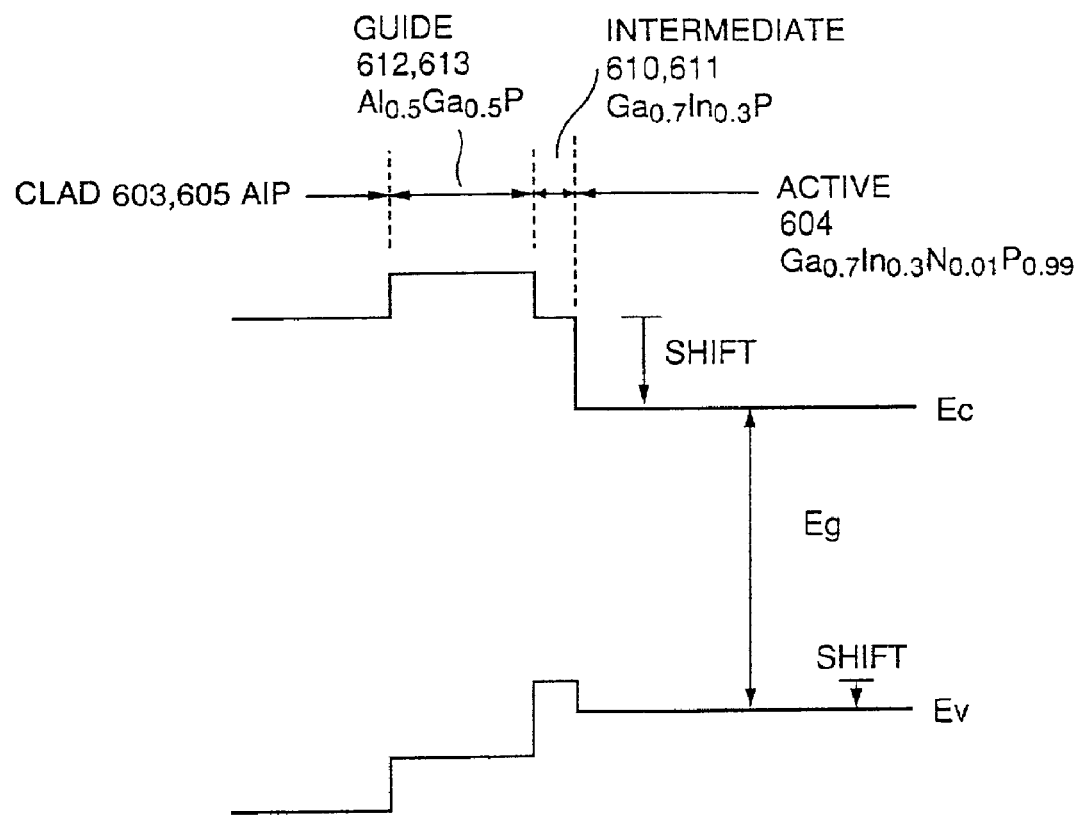

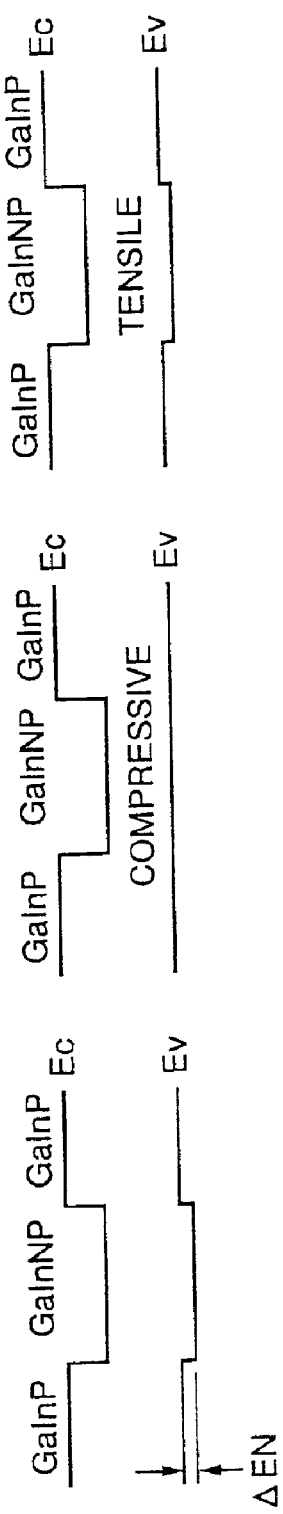
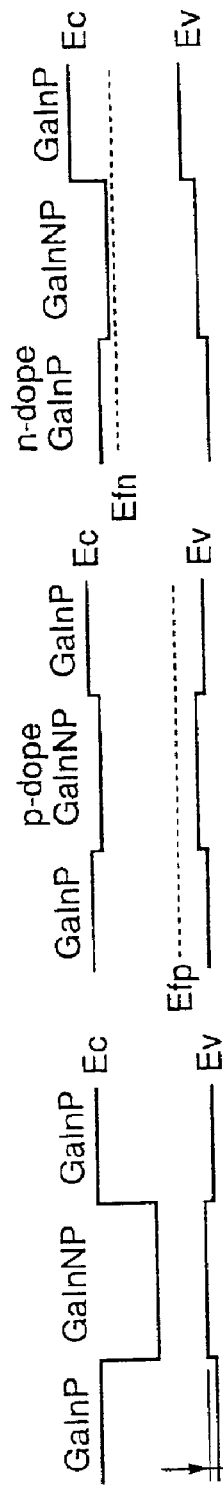

FIG.20A
FIG.20B
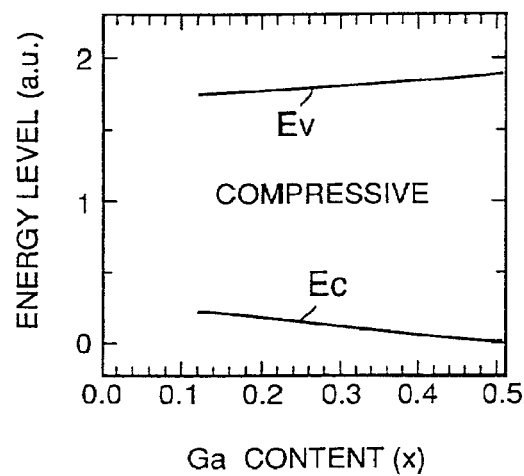
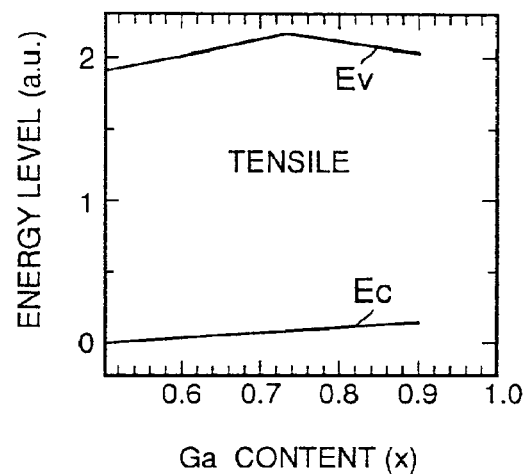

LASER DIODE HAVING AN ACTIVE LAYER CONTAINING N AND OPERABLE IN A 0.6 µM WAVELENGTH BAND

The present invention is a continuation-in-part application of the U.S. patent application Ser. No. 09/289,955 filed Apr. 13, 1999, now U.S. Pat. No. 6,563,851.

BACKGROUND OF THE INVENTION

The present invention generally relates to optical semiconductor devices and more particularly to an optical semiconductor device including a laser diode operable in a 0.6 µm wavelength band.

The optical wavelength band of 0.6 µm is used extensively in storage devices such as an optical disk drive or a magneto-optical disk drive for optical writing or reading of information. Further, the optical wavelength band of 0.6 µm is important in optical telecommunication that is conducted by using plastic optical fibers.

Thus, intensive investigations are being made in relation to a laser diode of an AlGaInP system that produces an output optical beam with the optical wavelength band of 0.6 µm. The laser diode using the AlGaInP system is also important in color display devices as an optical source of red to green colors. It should be noted that the AlGaInP system is a III-V material providing the largest bandgap (2.3 eV or 540 nm wavelength) while simultaneously maintaining a lattice matching with a GaAs substrate.

On the other hand, such a laser diode using the AlGaInP system for the active layer thereof suffers from the problem of poor confinement of carriers, particularly electrons, in the active layer. More specifically, carriers escape easily from the active layer to adjacent upper and/or lower cladding layers due to the small band discontinuity formed at the heterojunction interface between the AlGaInP active layer and the adjacent cladding layers. Associated with such a small band discontinuity and resultant weak carrier confinement, the conventional AlGaInP laser diodes have suffered from the problem of large temperature dependence for the threshold characteristic of the laser oscillation. This problem of poor temperature characteristic of the laser diode is pronounced further when the bandgap of the active layer is increased for decreasing the laser oscillation wavelength by using a quantum well structure for the active layer.

In order to avoid the problem of overflowing of the carriers away from the active layer, the Japanese Laid-Open Patent Publication 4-114486 describes the use of a multiple quantum barrier (MQB) structure for the carrier blocking layer. Further, Hamada, H. et al., Electronics Letters, vol.28, no.19, 10th Sep. 1992, pp.1834–1836, describes the use of a strained MQW structure strained with a compressive stress. According to Hamada et al., op. cit., a continuous laser oscillation with a wavelength of as small as 615 nm is achieved by forming the strained MQW structure by using a quantum well layer having a composition of $(Al_{0.08}Ga_{0.92})_{0.45}In_{0.55}As$ in combination with a barrier layer and a GaAs substrate. However, the laser diode of thus produced has an unsatisfactory temperature characteristic, indicating that the desired, effective confinement of carriers is not realized.

Further, there is another proposal of a laser diode operable in the 600 nm wavelength band by using the material system of AlGaInP in combination with a substrate other than GaAs. For example, the Japanese Laid-Open Patent Publication 6-53602 proposes the use of an MQW structure including GaInP quantum well layers and GaInP barrier layers for the active layer in combination with a GaP substrate and AlGaP cladding layers. The foregoing reference further teaches the use of N as an impurity element forming an isoelectronic trap. This device, however, cannot provide the satisfactory confinement of carriers in the active layer. Thereby, the laser diode is characterized by a poor temperature characteristic.

Further, Japanese Laid-Open Patent Publication 7-7223 describes a laser diode operable in the wavelength band of 600 nm by using a III-V material containing N, such as InNSb or AlNSb in combination with a Si substrate or a GaP substrate. According to the reference, it becomes possible to form the laser diode on a Si substrate or a GaP substrate by incorporating N into such a III-V material. In the foregoing prior art, a composition of $AlN_{0.4}Sb_{0.6}$ is proposed as a lattice matching composition to the Si substrate, wherein it is described that a bandgap energy of about 4 eV corresponding to a ultraviolet wavelength band is obtained at such a lattice matching composition.

Unfortunately, such a III-V material system containing N generally shows a severe bowing in the bandgap due to the large electronegativity of N, and the desired increase of the bandgap is not achieved in the foregoing lattice matching composition, contrary to the prediction of the foregoing Japanese Laid-Open Patent Publication 7-7223. Further, in view of the existence of extensive immiscibility gap in the III-V material system containing N, formation of a III-V crystal containing such a large amount of N is not possible even when a non-equilibrium growth process such as MBE process or MOCVD process is used.

Thus, it has been difficult to achieve the laser oscillation at the 600 nm wavelength band even when other material systems are used. The use of the AlGaInP system, on the other hand, cannot provide the desired efficient confinement of carriers in the active layer due to the insufficient band discontinuity at the heterojunction interface between the active layer and the cladding layer.

SUMMARY OF THE INVENTION

Accordingly, it is a general object of the present invention to provide a novel and useful laser diode operable in the 600 nm wavelength band wherein the problems are eliminated.

Another and more specific object of the present invention to provide a laser diode operable in the 600 nm wavelength band with effective confinement of carriers in the active layer of the laser diode.

Another object of the present invention is to provide a laser diode, comprising:

a substrate of a first conductivity type;

a first cladding layer having said first conductivity type, said first cladding layer being formed on said substrate epitaxially;

an active layer of a group III-V compound semiconductor material formed epitaxially on said first cladding layer;

a second cladding layer having a second, opposite conductivity type, said second cladding layer being formed on said active layer epitaxially;

a first electrode injecting first type carriers having a first polarity into said active layer; and a second electrode injecting second type carriers having a second, opposite polarity into said active layer, said active layer having a composition of GaInNP containing therein N as a group V element.

According to the present invention, a large band discontinuity is guaranteed at the interface between the active layer and the first or second cladding layer as a result of the use of GaInNP for the active layer, and the efficiency of carrier confinement is improved substantially. By adjusting the amount of N in the GaInNP active layer, it becomes possible to set the band offset at the interface between the active layer and the first or second cladding layer as desired. Thereby, the laser diode shows an excellent temperature characteristic and operates stably at the room temperature environment. Further, as a result of the use of GaInNP for the active layer, the laser diode operates in the visible wavelength band including the 600 nm band. As the active layer of GaInNP is free from reactive Al, the growth of the active layer is conducted easily, without inducing island growth or associated problem of deterioration of crystal quality.

Another object of the present invention is to provide a vertical-cavity laser diode, comprising:

a substrate having a first conductivity type;

a first optical reflector provided on said substrate;

a first cladding layer having said first conductivity type on said first optical reflector in an epitaxial relationship with said substrate;

an active layer of a group III-V compound semiconductor material formed epitaxially on said first cladding layer;

a second cladding layer having a second, opposite conductivity type on said active layer in an epitaxial relationship with said active layer;

a second optical reflector provided on said second cladding layer;

a first ohmic electrode provided in ohmic contact with said substrate; and a second ohmic electrode provided in ohmic contact with said second cladding layer;

said active layer having a composition of GaInNP containing therein N as a group V element.

According to the present invention, an efficient vertical cavity laser diode operable in the visible wavelength band is obtained. As a result of use of GaInNP for the active layer, a large band discontinuity is guaranteed at the interface between the active layer and the first or second cladding layer, and the efficiency of carrier confinement is improved substantially. By adjusting the amount of N in the GaInNP active layer, it becomes possible to set the band offset at the interface between the active layer and the first or second cladding layer as desired. Thereby, the laser diode shows an excellent temperature characteristic and operates stably at the room temperature environment. Further, as a result of the use of GaInNP for the active layer, the laser diode operates in the visible wavelength band including the 600 nm band. As the active layer of GaInNP is free from reactive Al, the growth of the active layer is conducted easily, without inducing island growth or associated problem of deterioration of crystal quality.

Another object of the present invention is to provide a method of fabricating a compound semiconductor device, comprising the step of:

(a) forming a first group III-V compound semiconductor layer epitaxially on a substrate;

(b) exposing a surface of said first group III-V compound semiconductor layer to an atmosphere containing N;

(c) forming, after said step (b), a second group III-V compound semiconductor layer on said first group III-V compound semiconductor layer epitaxially, said second group III-V compound semiconductor layer containing therein N as a group V element, wherein said atmosphere is substantially free from a group III element.

According to the present invention, a part of the atoms constituting the group V element of the first group III-V compound semiconductor layer are replaced with N, and the epitaxial growth of the second group III-V compound semiconductor layer on the first group III-V compound semiconductor layer is facilitated substantially.

Another object of the present invention is to provide a semiconductor layered structure, comprising:

a first epitaxial layer of AlGaInNP having a composition represented by compositional parameters x1, y1 and z1 ($0 \leq x1 < 1$, $0 < y1 \leq 1$, $0 < z1 < 1$) as $Al_{x1}Ga_{y1}In_{(1-x1-y1)}N_{z1}P_{(1-z1)}$;

a second epitaxial layer of AlGaInP having a composition represented by compositional parameters x2 and y2 as $Al_{x2}Ga_{y2}In_{(1-x2-y2)}P$, said second epitaxial layer being disposed adjacent to said first epitaxial layer; and a third epitaxial layer of AlGaInP having a composition represented by compositional parameters x3 and y3 as $Al_{x3}Ga_{y3}In_{(1-x3-y3)}P$, said third epitaxial layer being disposed between said first and second epitaxial layers, said first through third epitaxial layers maintaining an epitaxy with each other;

wherein said compositional parameters are set so as to satisfy the relationship:

$0 \leq x3 < x2 \leq 1$; $0 < y3 \leq 1$.

According to the present invention, the use of AlGaInNP composition, which includes N, for the first layer enables an efficient incorporation of N thereinto as a result of the interaction between Al and N. Thereby, the content of N thus incorporated into the first epitaxial layer can be controlled by controlling the content of Al therein. As a result of the improvement in the efficiency of incorporation of N, the amount of the N-source used in the epitaxial process is reduced and the cost of forming the layered structure is reduced. As such a layered structure contains N in the first epitaxial layer with a substantial amount, a variety of band structures, hitherto not possible, can be realized easily.

Another object of the present invention is to provide a semiconductor light-emitting device, comprising:

a substrate of a first conductivity type;

a first cladding layer of AlGaInP of said first conductivity type provided on said substrate;

an active layer of undoped AlGaInNP provided on said cladding layer; and a second cladding layer of AlGaInP of a second, opposite conductivity type provided on said active layer;

said active layer having a composition represented by compositional parameters x1, y1 and z1 as $Al_{x1}Ga_{y1}In_{(1-x1-y1)}N_{z1}P_{(1-z1)}$ ($0 \leq x1 < 1$, $0 < y1 \leq 1$, $0 < z1 < 1$), said first cladding layer having a composition represented by compositional parameters x2 and y2 as $Al_{x2}Ga_{y2}In_{(1-x2-y2)}P$, wherein there is provided an intermediate layer of AlGaInP between said first cladding layer and said active layer, said intermediate layer having a composition represented by compositional parameters x3, y3 and z3 as $Al_{x3}Ga_{y3}In_{(1-x3-y3)}P$, said compositional parameters satisfying the relationship: $0 \leq x3 < x2 \leq 1$; $0 < y3 \leq 1$.

According to the present invention, the use of AlGaInNP composition, which includes N, for the active layer enables an efficient incorporation of N thereinto as a result of the interaction between Al and N. Thereby, the content of N thus incorporated can be controlled by controlling the content of Al of the active layer. As a result of the improvement in the efficiency of incorporation of N, the amount of the N-source used in the epitaxial process for forming the AlGaInNP active layer is reduced and the cost of forming the layered structure is reduced. By interposing the intermediate layer containing minimum amount of Al between the first cladding layer and the active layer, the segregation of N at the lower boundary of the active layer is effectively eliminated, and the quality of the AlGaInNP crystal constituting the active layer is improved. As the active layer contains both Al and N, the decrease of the bandgap energy caused by the incorporation of N into the active layer is compensated for by Al, and the light-emitting device produces a short optical wavelength radiation. Due to the downward shifting of the conduction band and valence band as a result of incorporation of N into the active layer AlGaInNP, there occurs an effective confinement of the electrons in the active layer.

Another object of the present invention is to provide a semiconductor light-emitting device, comprising:

a substrate of a first conductivity type;

a first cladding layer said first conductivity type provided on said substrate;

a first optical waveguide layer of undoped AlGaInP provided on said first cladding layer;

an active layer of undoped AlGaInNP provided on said optical waveguide layer;

a second optical waveguide layer of undoped AlGaInP provided on said active layer; and a second cladding layer of a second, opposite conductivity type provided on said second optical waveguide layer said active layer having a composition represented by compositional parameters x1, y1 and z1 as $Al_{x1}Ga_{y1}In_{(1-x1-y1)}N_{z1}P_{(1-z1)}$ ($0 \leq x1 < 1$, $0 < y1 \leq 1$, $0 < z1 < 1$), said first optical waveguide layer having a composition represented by compositional parameters x2 and y2 as $Al_{x2}Ga_{y2}In_{(1-x2-y2)}P$, wherein there is provided an intermediate layer of AlGaInP between said first optical waveguide layer and said active layer, said intermediate layer having a composition represented by compositional parameters x3 and y3 as $Al_{x3}Ga_{y3}In_{(1-x3-y3)}P$, said compositional parameters satisfying the relationship $0 \leq x3 < x2 \leq 1$; $0 < y3 \leq 1$.

According to the present invention, the use of AlGaInNP composition, which includes N, for the active layer enables an efficient incorporation of N thereinto as a result of the interaction between Al and N. Thereby, the content of N thus incorporated can be controlled by controlling the content of Al of the active layer. As a result of the improvement in the efficiency of incorporation of N, the amount of the N-source used in the epitaxial process for forming the AlGaInNP active layer is reduced and the cost of forming the layered structure is reduced. By interposing the intermediate layer containing minimum amount of Al between the first optical waveguide layer and the active layer, the segregation of N at the lower boundary of the active layer is effectively eliminated, and the quality of the AlGaInNP crystal constituting the active layer is improved. As the active layer contains both Al and N, the decrease of the bandgap energy caused by the incorporation of N into the active layer is compensated for by Al, and the light-emitting device produces a short optical wavelength radiation. Due to the downward shifting of the conduction band and valence band as a result of incorporation of N into the active layer AlGaInNP, there occurs an effective confinement of the electrons in the active layer.

Another object of the present invention is to provide a method of fabricating a semiconductor layered structure comprising a first epitaxial layer of AlGaInNP having a composition represented by compositional parameters x1, y1 and z1 as $Al_{x1}Ga_{y1}In_{(1-x1-y1)}N_{z1}P_{(1-z1)}$ ($0 \leq x1 < 1$, $0 < y1 \leq 1$, $0 < z1 < 1$), a second epitaxial layer of AlGaInP having a composition represented by compositional parameters x2 and y2 as $Al_{x2}Ga_{y2}In_{(1-x2-y2)}P$, said second epitaxial layer being disposed adjacent to said first epitaxial layer, and a third epitaxial layer of AlGaInP having a composition represented by compositional parameters x3 and y3 as $Al_{x3}Ga_{y3}In_{(1-x3-y3)}P$, said third epitaxial layer being disposed between said first and second epitaxial layers, said first through third epitaxial layers maintaining an epitaxy with each other, said compositional parameters being set so as to satisfy the relationship ($0 \leq x3 < x2 \leq 1$; $0 < y3 \leq 1$), said method comprising the steps of:

forming said first epitaxial layer by using a metal organic compound of Al for the source of Al;

forming said second epitaxial layer by using a metal organic compound of Al for the source of Al; and forming said third epitaxial layer by using a metal organic compound of Al for the source of Al.

According to the present invention, it becomes possible to control the content of N in the epitaxial layers by controlling the Al content thereof. For example, it becomes possible to increase the N content of the first epitaxial layer by increasing the Al content thereof. Further, the quality of the first epitaxial layer is improved by decreasing or minimizing the Al content of the third epitaxial layer, such that there occurs no segregation of N at the interface between the first epitaxial layer and the third epitaxial layer.

Other objects and further features of the present invention will become apparent from the following detailed description of the invention when read in conjunction with the attached drawings.

BRIEF DESCRIPTION OF THE DRAWINGS

FIG. 7 is a diagram showing the band structure of the laser diode of FIG. 6;

FIGS. 19A–19F are diagrams showing various possible band structures for a laser diode according to a twelfth embodiment of the present invention;

FIGS. 20A and 20B are diagrams showing the effect of strain on the band structure in the laser diode of the twelfth embodiment of the present invention;

DETAILED DESCRIPTION OF THE PREFERRED EMBODIMENT

[Principle]

Figure 1:
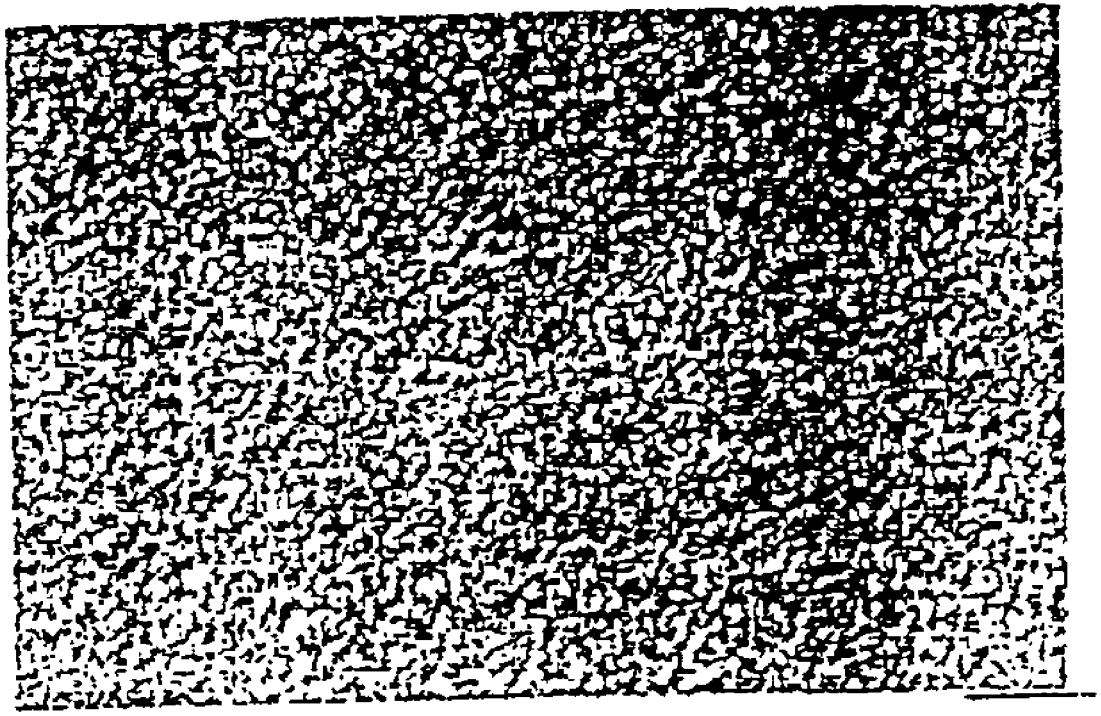
FIG. 1 is a diagram explaining a first embodiment of the present invention.

The present invention provides an optical semiconductor device operable in the visible wavelength band of 0.6 μm such as 630 nm or 650 nm with high efficiency and excellent stability, by using a mixed crystal of GaInNP for the active layer in combination with a cladding layer of a mixed crystal of AlGaInP.

The inventor of the present invention has previously discovered that the bandgap of an AlGaInP mixed crystal is reduced substantially by adding thereto a small amount of N as a group V element. The mixed crystal thus containing N has a composition represented as AlGaInNP. Further, such an admixing of N results in a decrease of energy both in the conduction band and in the valence band, and the efficiency of electron confinement in the potential well, formed in the conduction band of the AlGaInNP active layer sandwiched by a pair of AlGaInP cladding layers, is improved substantially. While such an addition of N results in a formation of a small potential bump in the valence band of the AlGaInNP active layer, the problem of formation of such a potential bump is easily resolved and the potential bump is converted to a potential well by merely choosing the composition of the AlGaInP cladding layers sandwiching the AlGaInNP active layer therebetween appropriately. It should be noted that the amount of decrease of the energy level caused as a result of incorporation of N is smaller in the valence band than in the conduction band, and there is formed an effective potential well both in the conduction band and in the valence band. The AlGaInNP active layer further has an advantageous feature of lattice matching with the GaAs substrate due to the effect of N that decreases the lattice constant of the AlGaInP mixed crystal. Because of the large band discontinuity of the potential well appearing particularly in the conduction band, the electrons are confined effectively in the AlGaInNP active layer and the laser diode operates stably in the room temperature environment.

In order to achieve such a desired relative shifting of the conduction band and the valence band in the mixed crystal of AlGaInNP, on the other hand, it is necessary to incorporate N with a concentration of at least $3 \times 10^{19}$ cm$^{-3}$. This concentration level of N substantially exceeds the concentration level of N introduced in an AlGaInP mixed crystal as an impurity element forming an isoelectronic trap. It should be noted that an isoelectronic trap is used commonly for converting an AlGaInP mixed crystal to a mixed crystal of the direction transition type.

When N is introduced in the AlGaInP mixed crystal with such a substantial amount, on the other hand, there arises a problem in that the quality of the resultant AlGaInNP mixed crystal is deteriorated substantially. As will be explained later in detail with reference to a preferred embodiment, such a substantial incorporation of N into a III-V mixed crystal containing Al invites a substantial formation of rough surface in the crystal layer of the mixed crystal, indicating the cause of the deterioration in the crystal quality, while the deterioration of the crystal quality facilitates non-optical recombination of carriers and the efficiency of the laser diode is deteriorated inevitably when such a III-V mixed crystal is used for the active layer of the laser diode. For example, the laser diode may show a large threshold current for laser oscillation.

On the other hand, the inventor of the present invention has newly discovered that there occurs no such deterioration in the crystal quality when N is introduced into a mixed crystal of GaInP, even in such a case in which the concentration of N exceeds the foregoing concentration level of $3 \times 10^{19}$ cm$^{-3}$. It is believed that the exclusion of reactive. Al, which tends to cause a three-dimensional growth, from the component constituting a group III-V mixed crystal contributes to the formation of high-quality III-V mixed crystal of GaInNP.

Further, such an exclusion of Al from the component of the group III-V mixed crystal reduces the number of the components constituting the III-V mixed crystal, while such a reduction in the number of the components reduces the tendency of immiscibility of the component elements, which is pertinent to such a multi-component mixed crystal system. It should be noted that such a III-V mixed crystal containing N generally has a composition showing immiscibility and the growth thereof by an equilibrium process is impossible. Thus, it has been necessary to employ a non-equilibrium growth process such as an MBE (molecular beam epitaxy) process or an MOCVD (metal-organic chemical vapor deposition) process in order to grow such a III-V mixed crystal containing N.

In the present invention, the foregoing problems pertinent to the AlGaInNP mixed crystal system is avoided successfully by using the GaInNP mixed crystal for the active layer of the laser diode. Thereby, it was discovered that it is preferable to increase the concentration of Ga in the mixed crystal, as the increased concentration of Ga in the mixed crystal also increases the allowable concentration of N therein. By increasing the concentration level of N as such, the energy level of the conduction band of the active layer is decreased, and the efficiency of electron confinement in the active layer is improved. Further, such an increase of the N content in the active layer reduces the bandgap of the GaInNP mixed crystal forming the active layer, while such a reduction of the bandgap of the active layer contributes to the reduction of the oscillation wavelength of the laser diode. Thereby, the laser diode successfully operates in the visible wavelength including the 600 nm wavelength band.

Meanwhile, the inventor of the present invention further discovered that the laser diode using such a GaInNP active layer shows a poor efficiency when the GaInNP active layer is grown directly on an optical guide layer or cladding layer of AlGaInNP, in spite of the fact that the quality of the GaInNP active layer itself is improved substantially. The reason of this unsatisfactory result is attributed to the existence of Al in the underlying optical waveguide layer or cladding layer, on which the GaInNP active layer is grown epitaxially. It is believed that the poor crystal quality of the surface of the AlGaInP layer is transferred to the active layer grown thereon.

In order to avoid this problem, the present invention proposes to separate the active layer of GaInNP from the cladding layer or optical waveguide layer of AlGaInP by using an intermediate layer of a group III-V compound semiconductor material that is substantially free form Al and N. By interposing such an intermediate layer between the GaInNP active layer and the cladding layer or optical waveguide layer of AlGaInP, the crystal quality of the active layer is improved further, and the efficiency of laser oscillation is improved substantially.

In order to avoid the unwanted increase of laser oscillation wavelength caused as a result of interaction of the carriers in the active layer with the intermediate layer, it is preferable for form the intermediate layer to have a thickness as small as possible as compared with the thickness of the GaInNP active layer but not smaller than a monoatomic layer thickness, such that the carriers in the active layer do not sense the effect of the potential barrier formed by the intermediate layer. As long as the thickness of the intermediate layer is sufficiently small, the perturbation caused in the wavefunction of the carries in the GaInNP active layer by the intermediate layer is held minimum. Further, in order to avoid the formation of a quantum well in the intermediate layer, it is preferable that the material of the intermediate layer forms the type-I heterojunction with the active layer rather than the type-II heterojunction. In order to improve the quality of the GaInNP active layer, it is preferable that the group III-V compound semiconductor material forming the intermediate layer is a binary or ternary compound in the maximum. Further increase in the number of the constituent elements is disadvantageous for securing the necessary quality for the GaInNP active layer.

When the laser diode is to be constructed on a GaAs substrate, the intermediate layer may be formed of GaInP. By using GaInP, a lattice matching is guaranteed with the cladding layer or optical waveguide layer, and the accumulation of strain in the GaInNP active layer is controlled relatively easily. Further, the use of similar component elements for the intermediate layer facilitates the growth of the necessary high-quality crystal for the active layer. Alternatively, it is also possible to use GaP for the intermediate layer, provided that the thickness of the GaP intermediate layer is set smaller than a critical thickness above which misfit dislocations are formed. By using GaP for the intermediate layer, the optical loss associated with the optical absorption in the intermediate layer is effectively suppressed as a result of the very large bandgap of GaP.

When the laser diode is to be constructed on a GaP substrate, on the other hand, the intermediate layer may be formed of GaInP with a composition having a large concentration for Ga. By choosing the composition of the GaInP intermediate layer to have a high concentration of Ga, the bandgap of the intermediate layer is increased and the lattice constant is reduced in conformity with the GaP substrate having a very small lattice constant. Thereby, the strain accumulated in the GaInNP active layer is reduced also as compared with the case of forming the laser diode on a GaAs substrate, due to the reduced lattice constant of the GaInNP mixed crystal caused as a result of admixing of N thereinto. By using GaInP for the intermediate layer, it is further possible to improve the quality of the active layer.

Further, the present invention proposes the use of an MQW structure for the active layer of the laser diode. Thereby, the MQW is formed as a result of a repetitive and alternate stacking of a GaInNP quantum well layer and a III-V barrier layer which may contain Al, wherein the foregoing intermediate layer of GaInP is interposed at the interface between the GaInNP quantum well layer and the adjacent III-V barrier layer, particularly at the interface between the GaInNP quantum well layer and the underlying barrier layer.

As the GaInP intermediate layer does not have a large bandgap comparable to that of the barrier layers, the GaInP intermediate layer thus formed adjacent to the GaInNP quantum well layer cannot form a potential barrier defining a quantum well for the GaInNP quantum well layer. Rather, the GaInP intermediate layer tends to form, together with the GaInNP quantum well layer, an effectively integral quantum well having an increased width. Thereby, it was discovered that the upper intermediate layer, locating above the GaInNP quantum well layer, can be omitted without reducing the efficiency of optical emission substantially, although such an omission of the upper intermediate layer induces a loss of symmetry in the wavefunction of the carriers confined in the effective quantum well. By omitting the upper intermediate layer, the problem of increase of the oscillation wavelength of the laser diode, caused as a result of increase in the thickness of the effective quantum well forming the active part of the laser diode, is avoided successfully.

[First Embodiment]

In a first embodiment of the present invention, a light-emitting semiconductor device having an active layer of a group III-V compound semiconductor material containing therein N and P as a group V element is fabricated. More specifically, the active layer of the first embodiment thus formed has a composition represented as $Ga_{x2}In_{1-x2}N_{z2}P_{1-z2}$ ($0 \leq x2 \leq 1$, $0 < z2 < 1$).

Figure 2:
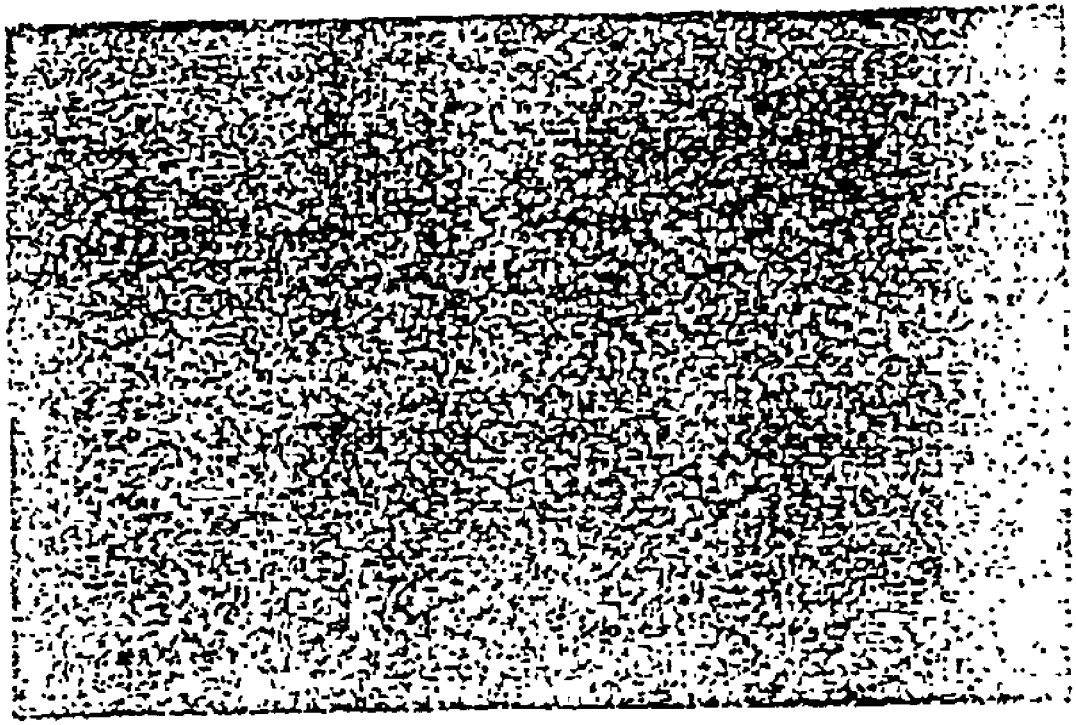
FIG. 2 is another diagram explaining the first embodiment of the present invention.

FIGS. 1 and 2 represent the surface of an AlGaInNP layer and a GaInNP layer formed on a GaAs substrate as the active layer of the light-emitting semiconductor device by an MOCVD process.

Referring to FIGS. 1 and 2, it should be noted that each of the AlGaInNP layer and the GaInNP layer was formed with a thickness of about 1 μm, and the deposition of the active layer was made on a crystal surface of the GaAs substrate inclined in the <011> direction from the (100) surface by an angle of 15°. The deposition was made by using TMG (tetramethyl gallium), TMA (tetramethyl aluminum), TMI (tetramethyl indium) and $PH_3$ as respective source of Ga, Al, In and P together with a carrier gas of $H_2$. Further, DMHy (dimethylhydradine) was used for the source of N. The amount of N to be added to the active layer was controlled such that any of the AlGaInNP active layer and the GaInNP active layer achieves a lattice matching with the GaAs substrate. More specifically, the composition of the AlGaInNP active layer was set to $Al_{0.1}Ga_{0.5}In_{0.5}N_{z2}P_{1-z2}$ ($0 < z2 < 1$), while the composition of the GaInNP active layer was set to $Ga_{0.5}In_{0.5}N_{z1}P_{1-z1}$ ($0 < z1 < 1$).

From FIGS. 1 and 2, it can be seen that the AlGaInNP layer of FIG. 1 shows a substantial roughness in the surface morphology thereof, while the GaInNP layer of FIG. 2 shows a mirror flat surface, in spite of the fact that the growth of the GaInNP layer of FIG. 2 was conducted under a disadvantageous condition for suppressing the surface roughness. More specifically, the MOCVD process of growing the GaInNP layer was conducted at a lower deposition temperature as compared with the case of depositing the AlGaInNP layer of FIG. 1 while supplying simultaneously a larger amount of DMHy. In the growth of the GaInNP layer, the ratio of the flow rate of DMHy to $PH_3$ ($DMHy/PH_3$) was set seventeen times as large as the case of growing the AlGaInNP layer.

As a result of incorporation of such a large amount of N without causing a deterioration in the quality of the crystal, a shift of photoluminescent spectrum of as much as 30 nm was observed in the longer wavelength side was observed as compared with the case in which the active layer contains no substantial amount of N. This indicates the decrease of the bandgap energy caused as a result of incorporation of N into the active layer of GaInNP. In the present embodiment, it was possible to introduce N successfully with a concentration level of $1 \times 10^{20}$ cm$^{-3}$, wherein the amount of N thus introduced is equivalent to 0.5% of the entire group V elements.

In the case of using AlGaInNP for the active layer, there arises a problem of poor efficiency of optical emission due to the deep level formed the mixed crystal of AlGaInNP by Al. Further, the incorporation of N further deteriorates the quality of the AlGaInNP mixed crystal layer. The present invention successfully avoids these problems by using GaInNP which is free from Al.

[Second Embodiment]

Figure 3:
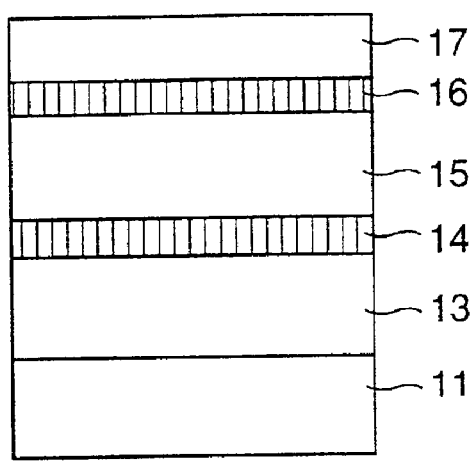
FIG. 3 is a diagram showing the layered structure according to a second embodiment of the present invention.

FIG. 3 shows the construction of a semiconductor layered structure 10 according to a second embodiment of the present invention.

Referring to FIG. 3, the semiconductor layered structure 10 includes an SQW (single quantum well) structure formed on a GaAs substrate 11 by an MOCVD process, wherein the SQW structure is formed on a buffer layer (not shown) of undoped GaAs formed on the GaAs substrate 11 epitaxially with a thickness of about 0.2 μm. The SQW structure, in turn, includes a barrier layer 13 of undoped AlGaInP having a composition of $(Al_{0.5}Ga_{0.5})_{0.49}In_{0.51}P$, wherein the barrier layer 13 is formed on the buffer layer epitaxially with a thickness of about 0.2 μm. The barrier layer 13, in turn, is covered by an intermediate layer 14 of undoped GaInP having a composition of $Ga_{0.65}In_{0.35}P$ and formed epitaxially on the barrier layer 13 with a thickness of about 1.2 nm, and an active layer 15 of undoped GaInNP having a composition of $Ga_{0.65}In_{0.35}N_{0.008}P_{0.992}$ is formed epitaxially on the intermediate layer 14 with a thickness of about 35 nm.

The active layer 15, in turn, is covered by an intermediate layer 16 of GaInP having a composition similar to that the intermediate layer 14 with a thickness of about 1.2 nm, and a cladding layer 17 of AlGaInP having a composition similar to that of the barrier layer 13 is formed epitaxially on the intermediate layer 16 with a thickness of about 50 nm.

In the structure of FIG. 3, it should be noted that both the upper and lower intermediate layers 14 and 16 have the thickness of about 1.2 nm, while this thickness corresponds to 2 molecular layers of GaInP. Further, it should be noted that the principal surface of the GaAs substrate 11, on which the structure of FIG. 3 is formed, is inclined in the <011> direction by an angle of about 15° from the (100) surface. The growth of the layers 13–17 is conducted by supplying TMG, TMI, TMA, $PH_3$ and $AsH_3$ into a reaction chamber of an MOCVD apparatus (not shown) with an appropriate combination, together with a carrier gas of $H_2$. During the growth of the GaInNP quantum well layer 15, DMHy is added to the source gas as a source of N.

It should be noted that the layers 13 and 17 of AlGaInNP have a large bandgap and act as a barrier layer sandwiching therebetween the active layer 15 of GaInNP as a quantum well layer, wherein each of the layers 13 and 17 having the foregoing composition of $(Al_{0.5}Ga_{0.5})_{0.49}In_{0.51}P$ achieves a lattice matching with the GaAs substrate 11. On the other hand, the intermediate layer 14 or 16 of the foregoing composition $(Ga_{0.65}In_{0.35}P)$ accumulates therein a tensile strain of about 1% when used in combination with the GaAs substrate 11. The active layer 15 of GaInNP has the composition substantially identical with the composition of the GaInP intermediate layer 14 or 16 except that the active layer 15 further contains N. By increasing the Ga content in the GaInNP mixed crystal of the active layer 15, the amount of N that can be brought into the active layer 15 is increased also. As noted above, the active layer 15 has a composition represented as $Ga_{0.65}In_{0.35}N_{0.008}P_{0.992}$.

Figure 4:
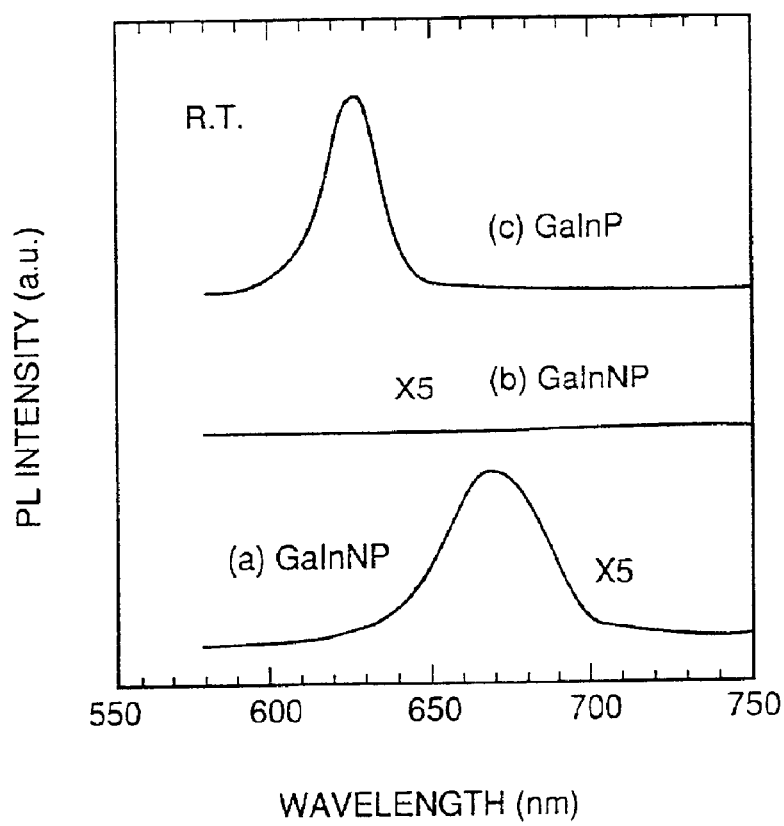
FIG. 4 is a diagram showing the PL spectrum of the layered structure of FIG. 3.

FIG. 4 shows the PL (photoluminescent) spectrum obtained for the structure of FIG. 3 in comparison with the case in which the intermediate layers 14 and 16 are omitted, wherein it should be noted that the curve (a) of FIG. 4 represents the PL spectrum of the structure of FIG. 3, the curve (b) represents the case in which the intermediate layers 14 and 16 are omitted from the structure of FIG. 3, while the curve (c) represents the case in which a GaInP mixed crystal free from N is used for the active layer 15 of FIG. 3.

Referring to FIG. 4, it can be seen that the PL wavelength represented by the curve (a) is shifted in the longer wavelength side (665 nm) with respect to the curve (c) corresponding to the PL wavelength of 626 nm, clearly demonstrating the effect of N that decreases the bandgap of the GaInP mixed crystal. It should be noted that the PL spectrum observed for the curve (a) is clear and distinct, indicating that the quality of the GaInNP mixed crystal used for the active layer 15 in the structure of FIG. 3 is excellent. In contrast, no PL peak was observed when the intermediate layers 14 and 16 are eliminated.

The result of FIG. 4 thus clearly demonstrates the effect of the intermediate layers 14 and 16 for improving the quality of the GaInNP mixed crystal used for the active layer 15 in the structure of FIG. 3.

In the SQW structure 10 of FIG. 3, it is further possible to tune the PL wavelength to the shorter wavelength side by decreasing the thickness of the active layer 15 such that there is formed a quantum well in the active layer 15. The structure of FIG. 3 can be used for various light-emitting devices and laser diodes as will be described hereinafter with reference to other embodiments.

[Third Embodiment]

Figure 5:
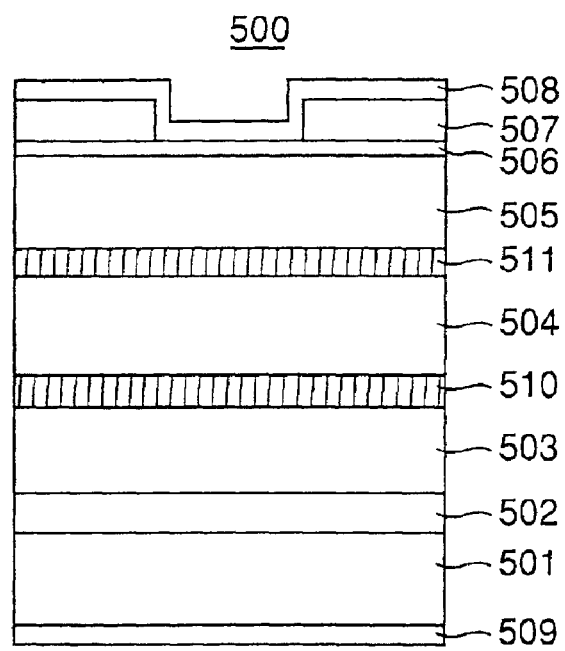
FIG. 5 is a diagram showing the construction of a laser diode according to a third embodiment of the present invention.

FIG. 5 shows the construction of a stripe laser diode 500 according to a third embodiment of the present invention based on the layered structure 10 of FIG. 3.

Referring to FIG. 5, the laser diode 500 is constructed on a substrate 501 of n-type GaAs having a principal surface inclined in the <011> direction from the (100) surface of GaAs by an angle of about 15° and includes a buffer layer 502 of n-type GaAs formed epitaxially on the foregoing principal surface of the substrate 501, wherein the buffer layer 502 carries thereon a lower cladding layer 503 of n-type AlGaInP formed epitaxially with a composition of $(Al_{0.7}Ga_{0.3})_{0.51}In_{0.49}P$, while the lower cladding layer 503 carries thereon an active layer 504 of undoped GaInNP formed also epitaxially with a composition of $Ga_{0.51}In_{0.49}N_{0.01}P_{0.99}$, wherein an intermediate layer 510 of GaP is interposed between the lower cladding layer 503 and the active layer 504. The intermediate layer 510 thus formed has a thickness of about 2 molecular layers, wherein the thickness is smaller than a critical thickness above which there occurs a formation of misfit dislocations in the intermediate layer 510 as a result of lattice misfit with respect to the GaAs substrate 501. Thereby, the intermediate layer 510 maintains an epitaxial relationship with the underlying AlGaInP cladding layer 503.

On the active layer 504, an upper cladding layer 505 of p-type AlGaInP is formed epitaxially with a composition substantially identical with the composition of the lower cladding layer 503 except for the conductivity type, wherein another intermediate layer 511 of GaP is interposed between the active layer 504 and the upper cladding layer 505 with a thickness smaller than the foregoing critical thickness. Thereby, the intermediate layer 511 maintains an epitaxial relationship with the underlying active layer 504.

Further, a contact layer 506 of p-type GaAs is formed on the upper cladding layer 505, wherein the contact layer 506 is covered by an insulating film 507 of $SiO_2$ and an upper, p-type electrode 508 of the AuZn/Au structure is formed on the insulating film 507 in ohmic contact with the GaAs contact layer 506 via a stripe opening formed in the insulating film 507. Further, a lower, n-type electrode 509 of the AuGe/Ni/Au structure is formed on the bottom surface of the GaAs substrate 501 in ohmic contact therewith.

It should be noted that the foregoing III-V semiconductor layers 502–506 and 510, 511 are formed typically by an MOCVD process or an MBE process, wherein the upper and lower cladding layers 503 and 505 having the composition described above achieve a lattice matching with the GaAs substrate 501. Further, the foregoing composition of the active layer 504 is the composition that achieves a lattice matching with the GaAs substrate. It should be noted that the admixing of N into the active layer 504 causes a decrease in the lattice constant, while the foregoing composition compensates for such a decrease in the lattice constant by increasing the Ga content.

By injecting holes into the active layer 504 from the top electrode 508 through the stripe opening formed in the insulating film 507, there occurs a stimulated emission in the central part of the active layer 504 as a result of recombination of the holes thus injected with the electrons that are injected from the bottom electrode 509. In the laser diode 500 of the present embodiment, it is of course possible to use a current confinement structure other than the stripe opening formed in the insulating film 507. Further, it is possible to use a strained active layer similar to the case of the second embodiment for the active layer 504 in the laser diode 500, as long as the strained active layer has a thickness smaller than the critical thickness. By straining the active layer, the range oscillation wavelength of the laser diode 500 is increased, and the laser diode having such a construction has an advantageous feature of degree of freedom in tuning the laser oscillation wavelength by inducing a quantum level in the active layer.

In the laser diode 500 of the present embodiment, it is possible to use GaAs or InP for the intermediate layer 510 or 511 in place of GaP. By using GaAs for the intermediate layers 510 and 511, the intermediate layers 510 and 511 achieve a perfect lattice matching with the GaAs substrate 500. In the case of using InP for the intermediate layers 510 and 511, on the other hand, it is necessary to set the thickness of the intermediate layers 510 and 511 to be smaller than a critical thickness above which there occurs a development of misfit dislocations in the intermediate layers 510 and 511. While it is also possible to use other group III-V material for the intermediate layers 510 and 511, it is desirable that the intermediate layers 510 and 511 have a bandgap as large as possible for avoiding optical loss in the active layer 504. The use of GaP noted above is particularly advantageous in view of the excellent quality of the GaInNP active layer 504 grown on the intermediate layer 510.

[Fourth Embodiment]

Figure 6:
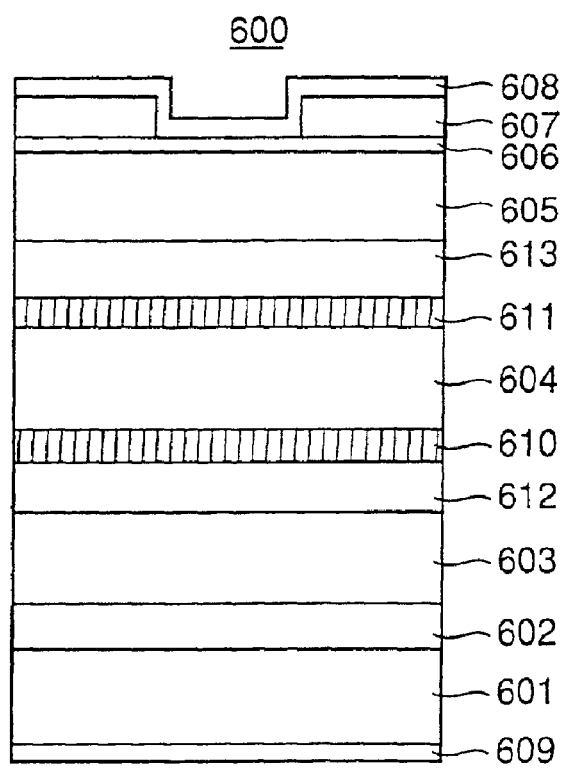
FIG. 6 is a diagram showing the construction of a laser diode according to a fourth embodiment of the present invention.

FIG. 6 shows the construction of a stripe laser diode 600 according to a fourth embodiment of the present invention.

Referring to FIG. 6, the laser diode 600 is constructed on a substrate 601 of n-type GaP carrying thereon a buffer layer 602 of n-type GaP, wherein the laser diode 600 includes a lower cladding layer 603 of n-type AlP, and an optical waveguide layer 612 of undoped AlGaP having a composition of $Al_{0.5}Ga_{0.5}P$ is grown epitaxially on the lower cladding layer 603. Further, the optical waveguide layer 612 is covered by an intermediate layer of GaInP having a composition of $Ga_{0.7}In_{0.3}P$ grown epitaxially on the optical waveguide layer 612, and an active layer 604 of GaInNP having a composition of $Ga_{0.7}In_{0.3}N_{0.01}P_{0.99}$ is formed epitaxially on the underlying optical waveguide layer 612.

The active layer 604, in turn, is covered by an intermediate layer 611 grown epitaxially with a composition substantially identical with the intermediate layer 612, and the intermediate layer 611 is covered by an optical waveguide layer 613 grown epitaxially on the intermediate layer 611 with a composition substantially identical with the optical waveguide layer 612. The optical waveguide layer 613, in turn, is covered by an upper cladding layer 605 of p-type AlP grown epitaxially on the optical waveguide layer 613, and a contact layer 606 of n-type GaP is formed further on the cladding layer 605.

The contact layer 606 is covered by an insulating film 607 of $SiO_2$, and a p-type electrode 608 provided on the insulating film 607 achieves an ohmic contact with the GaP contact layer 606 via a stripe opening formed in the insulating film 607. Further, an n-type electrode 609 is formed on the bottom surface of the GaP substrate 601 in ohmic contact therewith.

It should be noted that the foregoing III-V semiconductor layers are grown on the GaP substrate 601 consecutively by an MOCVD process while using the gaseous source materials noted before, and there is formed a double heterostructure including the active layer 604 and the upper and lower cladding layers 603 and 605 as the essential part of the laser diode 600.

In the laser diode 600 having such a construction, it should be noted that the active layer 604 of GaInNP is a material derived from GaInP, while GaInP is the direct-transition type semiconductor material having the largest bandgap. By introducing a small amount of N, the GaInNP active layer 604 generally achieves a lattice matching with the GaP substrate 601.

In the laser diode 600 of FIG. 6, the intermediate layers 610 and 611 are formed of a GaInP layer having a composition of $Ga_{0.7}In_{0.3}P$ and a thickness of 2 molecular layers, while the intermediate layers 610 and 611 may also be formed of GaP. In this case, the intermediate layers 610 and 611 achieve an ideal lattice matching with the GaP substrate 601.

FIG. 7 shows the band diagram of the laser diode 600 of FIG. 6 for the part including the active layer 604, intermediate layers 610 and 611 of $Ga_{0.7}In_{0.3}P$, optical waveguide layers 612 and 613 of $Al_{0.5}Ga_{0.5}P$, and cladding layers 603 and 605 of AlP.

Referring to FIG. 7, it can be seen that the conduction band Ec and the valence band Ev of the active layer 604 is shifted in the lower energy side with respect to the intermediate layer 610 or 611, causing a staggered, type-II heterojunction interface between the active layer 604 and the intermediate layer 610 or 611. Thereby, the efficiency of confinement of electrons in the potential well formed in the conduction band Ec in correspondence to the active layer 604 is improved. Further, it should be noted that there is formed an effective potential well for the holes in the valence band Ev between the active layer 604 and the cladding layer 603 or 605. Thus, an effective confinement of holes in the active layer 604 is maintained, and the efficiency of the laser diode 600 or the temperature stability of the operational characteristic thereof is improved substantially.

In the band diagram of FIG. 7, it should be noted that the magnitude of the foregoing energy shift of the active layer 604 is smaller in the valence band Ev than in the conduction band Ec, due to the decrease of the bandgap of GaInNP caused as a result of incorporation of N thereinto.

As the cladding layer 603 or 605 has a refractive index substantially smaller than the refractive index of the optical waveguide layers 612 and 613, there occurs also an effective optical confinement of photons in the active layer 604 where the stimulated emission takes place. The composition of the optical waveguide layers 612 and 613 or the composition of the cladding layers 603 and 605 is of course not limited to the foregoing combination but any other compositions may be used as long as the composition of the optical waveguide layers 612 and 613 is represented as $Al_{y1}Ga_{1-y1}P$ ($0 \leq y1 < 1$) and the composition of the cladding layers 603 and 604 is represented as $Al_{y2}Ga_{1-y2}P$ ($0 \leq y1 < y2 \leq 1$).

In the laser diode 600 of FIG. 6, the use of GaInNP containing N and simultaneously a substantial amount of Ga for the active layer 604 reduces the lattice constant of the active layer 604 and hence the compressive stress accumulated therein when combined with the substrate 601 of GaP. Note that GaP forming the substrate 601 has a very small lattice constant. Thus, the laser diode 600 is advantageous for reducing the laser oscillation wavelength. Further, due to the reduced lattice misfit, the active layer 604 grown on the Al-free intermediate layer 610 has an excellent crystal quality and the efficiency of laser oscillation is facilitated further.

[Fifth Embodiment]

Figures 8A, 8B:
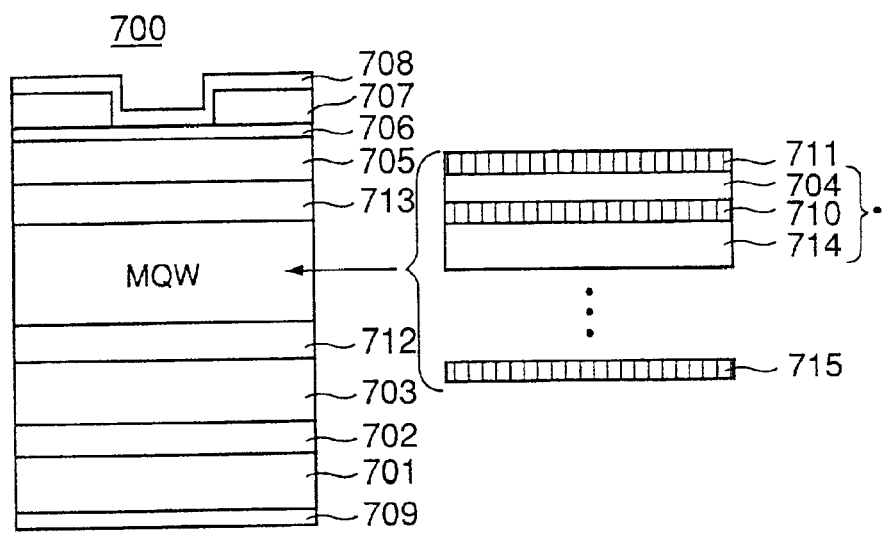
FIGS. 8A and 8B are diagrams showing the construction of a laser diode according to a fifth embodiment of the present invention.

FIG. 8A shows the construction of a laser diode 700 according to a fifth embodiment of the present invention.

Referring to FIG. 8A, the laser diode 700 is constructed on a substrate 701 of n-type GaAs having a principal surface inclined in the <011> direction from the (100) surface of GaAs by an angle of about 15° and includes a buffer layer 702 of n-type GaAs formed epitaxially on the foregoing principal surface of the substrate 701, wherein the buffer layer 702 carries thereon a lower cladding layer 703 of n-type AlGaInP formed epitaxially with a composition of $(Al_{x1}Ga_{1-x1})_{0.51}In_{0.49}P$ ($0 < x1 \leq 1$), while the lower cladding layer 703 carries thereon an active layer having an MQW structure shown in FIG. 8B, wherein an optical waveguide layer 712 of n-type AlGaInP having a composition of $(Al_{x2}Ga_{1-x2})_{0.51}In_{0.49}P$ ($0 < x2 < x1 \leq 1$) is interposed between the lower cladding layer 703 and the MQW structure constituting the active layer.

On the MQW active layer, there is formed an upper cladding layer 705 of p-type AlGaInP epitaxially with a composition substantially identical with the composition of the lower cladding layer 703 except for the conductivity type, and another optical waveguide layer 713 of p-type AlGaInP is interposed between the active layer and the upper cladding layer 705 with a composition substantially identical with the composition of the lower optical waveguide layer 713.

Further, a contact layer 706 of p-type GaAs is formed on the upper cladding layer 705, wherein the contact layer 706 is covered by an insulating film 707 of $SiO_2$ and an upper, p-type electrode 708 of the AuZn/Au structure is formed on the insulating film 707 in ohmic contact with the GaAs contact layer 706 via a stripe opening formed in the insulating film 707. Further, a lower, n-type electrode 709 of the AuGe/Ni/Au is formed on the bottom surface of the GaAs substrate 701 in ohmic contact therewith.

The foregoing semiconductor layers may be formed by an MOCVD process with the gaseous source materials used in the preceding embodiments.

FIG. 8B shows the MQW structure forming the active layer of the laser diode 700.

Referring to FIG. BB, the active layer includes a repetitive stacking of the structural unit including a barrier layer 714 of undoped AlGaInP having a composition identical with the composition of the AlGaInP cladding layer 712 or 713 except for the conductivity type and a quantum well layer 704 of an undoped GaInNP having a composition of $Ga_{0.51}In_{0.49}N_{0.01}P_{0.99}$ formed on the barrier layer 714, wherein there is interposed an intermediate layer 710, 711 . . . 715 of undoped GaInP having a composition of $Ga_{0.51}In_{0.49}P$ at both upper and lower interface boundaries of each quantum well layer 704.

By interposing the undoped GaInP intermediate layers 710 and 711 at both upper and lower interface boundaries of the quantum well layer 704 constituting the MQW structure as such, an excellent quality is guaranteed for the quantum well layers 704 grown on such GaInP intermediate layers free from Al. In the embodiment of FIG. 8B, it should be noted that a further intermediate layer 815 having the composition identical with the composition of the intermediate layer 710 or 711.

[Sixth Embodiment]

Figures 9A, 9B:
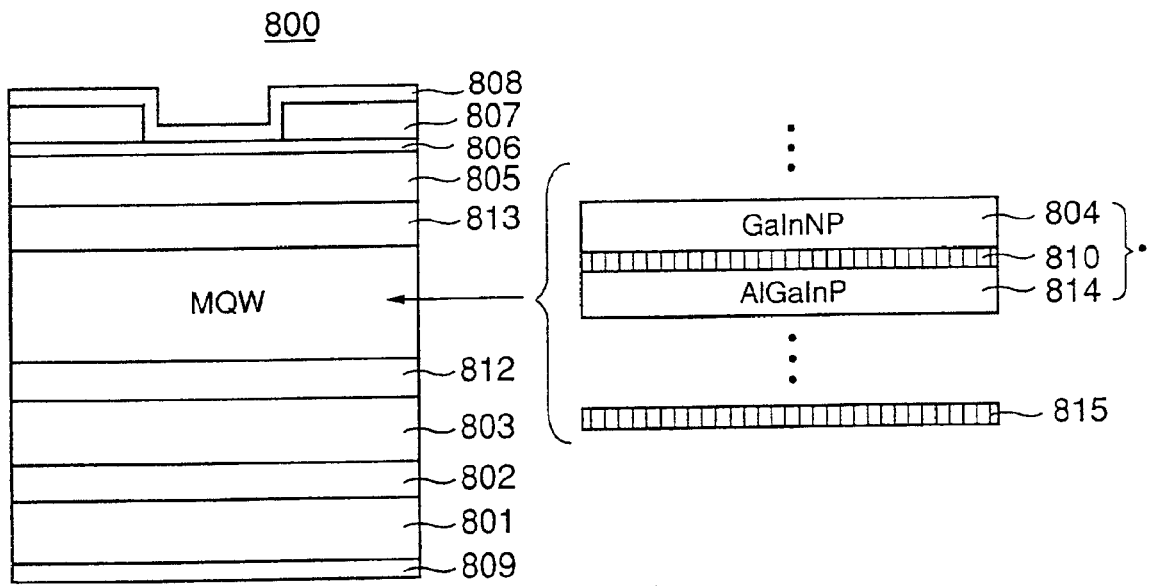
FIGS. 9A and 9B are diagrams showing the construction of a laser diode according to a sixth embodiment of the present invention.

FIG. 9A shows the construction of a laser diode 800 according to a fifth embodiment of the present invention.

Referring to FIG. 9A, the laser diode 800 is constructed on a substrate 801 of n-type GaAs having a principal surface inclined in the <011> direction from the (100) surface of GaAs by an angle of about 15° and includes a buffer layer 702 of n-type GaAs formed epitaxially on the foregoing principal surface of the substrate 801, wherein the buffer layer 802 carries thereon a lower cladding layer 803 of n-type AlGaInP formed epitaxially with a composition of $(Al_{x1}Ga_{1-x1})_{0.51}In_{0.49}P$ ($0<x1\leq1$), while the lower cladding layer 803 carries thereon an active layer having an MQW structure shown in FIG. 9B, wherein an optical waveguide layer 812 of n-type AlGaInP having a composition of $(Al_{x2}Ga_{1-x2})_{0.51}In_{0.49}P$ ($0<x2<x1\leq1$) is interposed between the lower cladding layer 803 and the MQW structure constituting the active layer.

On the MQW active layer, there is formed an upper cladding layer 805 of p-type AlGaInP epitaxially with a composition substantially identical with the composition of the lower cladding layer 803 except for the conductivity type, and another optical waveguide layer 813 of p-type AlGaInP is interposed between the active layer and the upper cladding layer 805 with a composition substantially identical with the composition of the lower optical waveguide layer 813.

Further, a contact layer 806 of p-type GaAs is formed on the upper cladding layer 805, wherein the contact layer 806 is covered by an insulating film 807 of $SiO_2$ and an upper, p-type electrode 708 of the AuZn/Au structure is formed on the insulating film 807 in ohmic contact with the GaAs contact layer 806 via a stripe opening formed in the insulating film 807. Further, a lower, n-type electrode 809 of the AuGe/Ni/Au is formed on the bottom surface of the GaAs substrate 701 in ohmic contact therewith.

The foregoing semiconductor layers may be formed by an MOCVD process with the gaseous source materials used in the preceding embodiments.

FIG. 9B shows the MQW structure forming the active layer of the laser diode 800.

Referring to FIG. 9B, the active layer includes a repetitive stacking of the structural unit including a barrier layer 814 of undoped AlGaInP having a composition identical with the composition of the AlGaInP cladding layer 812 or 813 except for the conductivity type and a quantum well layer 804 of an undoped GaInNP having a composition of $Ga_{0.51}In_{0.49}N_{0.01}P_{0.99}$ formed on the barrier layer 814, wherein there is interposed an intermediate layer 810 of undoped GaInP having a composition of $Ga_{0.51}In_{0.49}P$ at a lower interface boundary of each quantum well layer 804.

By interposing the undoped GaInP intermediate layer 810 at both the lower interface boundary of each quantum well layer 804 constituting the MQW structure as such, an excellent quality is guaranteed for the quantum well layers 804 grown on such GaInP intermediate layer 810 free from Al.

Figure 10:
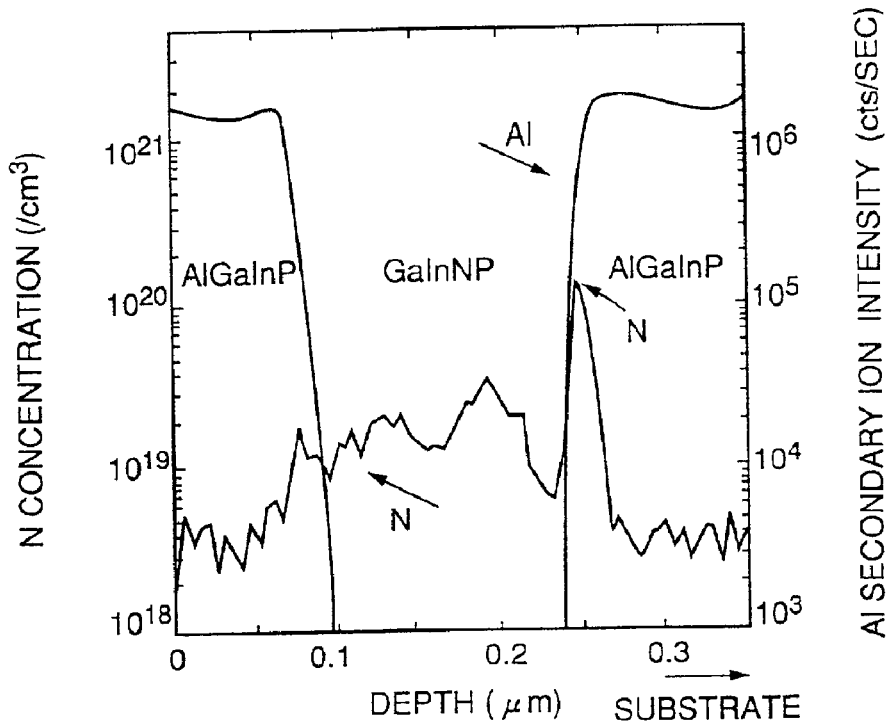
FIG. 10 is a SIMS profile for the structure of FIG. 9B.

FIG. 10 shows the SIMS profile for a layered structure in which epitaxial layers of AlGaInP, GaInNP and AlGaInP are formed consecutively on a GaAs substrate, without interposing an intermediate layer of GaInP at the upper and lower interface boundaries of the GaInNP epitaxial layer.

Referring to FIG. 10, it can be seen that there occurs a remarkable segregation of N at the top surface of the AlGaInP epitaxial layer on which the GaInNP epitaxial layer is to be formed, while no such a segregation of N is observed at the top surface of the GaInNP epitaxial layer on which the upper AlGaInP epitaxial layer is to be formed. It is believed that such a segregation of N at the top surface of the lower AlGaInP layer is caused as a result of interaction of N with the chemically reactive Al contained in the lower AlGaInP epitaxial layer, while it is believed that such an interaction causes the roughing in the top surface of the lower AlGaInP epitaxial layer. It should be noted that no such a roughing is observed for the top surface of the GaInNP epitaxial layer, and the GaInNP epitaxial layer thus grown has a mirror-flat top surface.

Thus, the MQW structure of FIG. 9B, in which the intermediate layer of undoped GaInP is interposed only at the interface between the bottom surface of the GaInNP quantum well layer and the underlying AlGaInP barrier layer, is still effective for maintaining the excellent crystal quality for the GaInNP quantum well layer. By omitting the upper intermediate layer corresponding to the layer 711 of FIG. 8B, the effective thickness of the quantum well formed by the quantum well layer 804 is reduced and the oscillation wavelength of the laser diode 800 is reduced.

Figure 11:
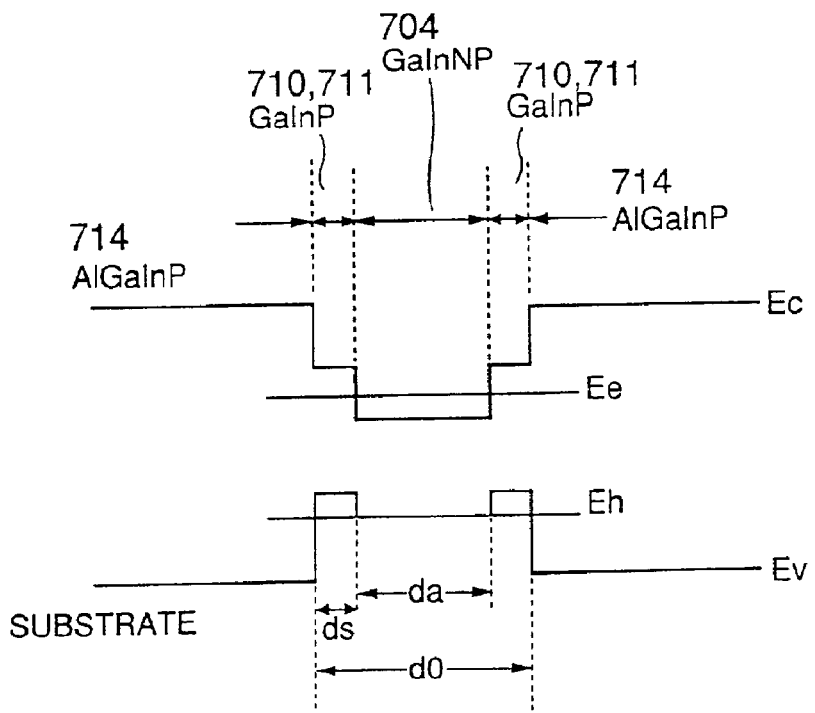
FIG. 11 is a diagram showing the possible band structure of the laser diode of FIG. 9B.
Figure 12:
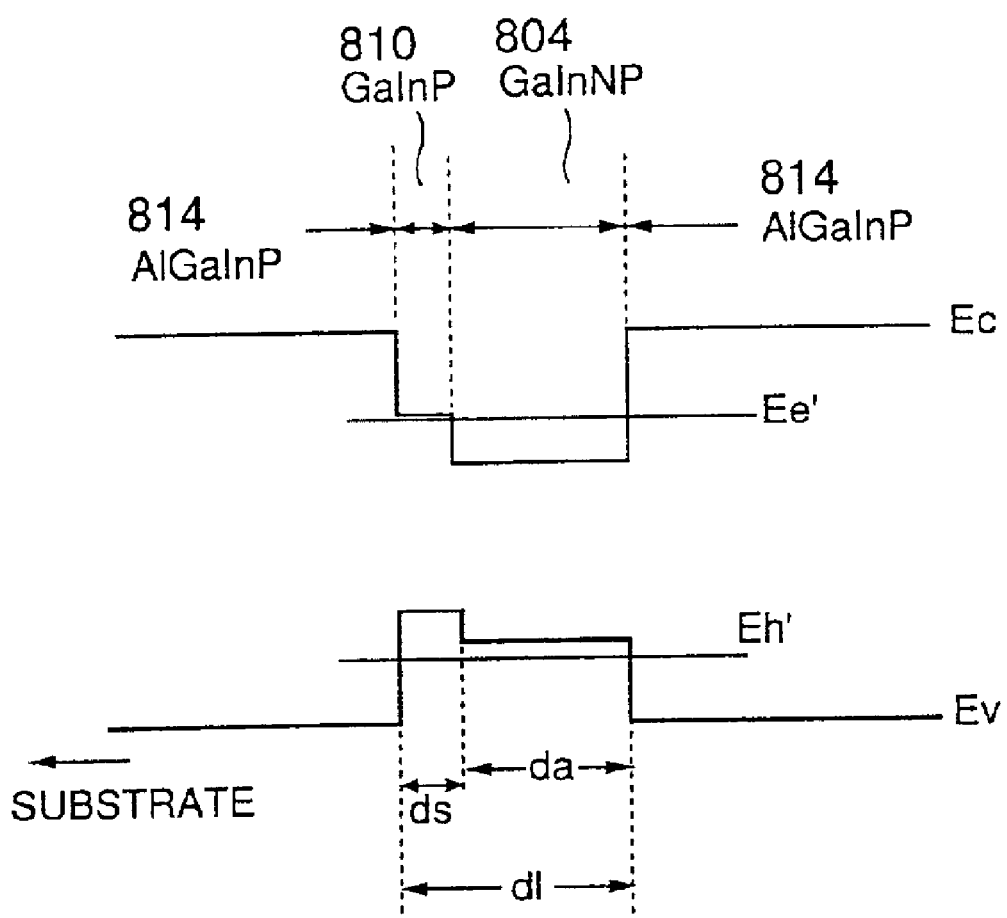
FIG. 12 is another diagram showing the band structure of the laser diode of FIG. 9B.

FIG. 11 shows the band diagram of the quantum well for the case of the laser diode 700 of FIG. 7B while FIG. 12 shows the band diagram of the quantum well for the laser diode 800 of FIG. 8B.

Referring to FIG. 11, it can be seen that the quantum well layer 704 of GaInNP having a thickness $d_a$ forms a staggered, type-II heterojunction interface with the intermediate layer 710 or 711 of GaInP, and there is formed a potential well of electrons in the conduction band Ec. As the thickness $d_s$ of the intermediate layer 710 or 711 is very small corresponding to the thickness of typically only 2 molecular layers, the effective potential well which the electrons in the quantum well layer 704 sense is relatively wide, having an effective well width $d_0$ generally equal to the sum of the thickness $d_a$ and twice the thickness $d_s$ ($d_a+2d_s$), and there is formed a quantum state $E_e$ for the electrons at a relatively low energy level in the conduction band Ec. Further, there is formed a quantum state $E_h$ for the holes in the valence band Ev at a relatively low energy level corresponding to the foregoing effective width $d_0$ of the quantum well in the valence band Ev.

In the band diagram of FIG. 11, It should be noted that the quantum well layer 704 forms a potential bump for the holes with respect to the intermediate layers 710 and 711 as a result of the formation of the staggered type-II heterojunction. Even in such a case, there is formed a quantum well for the holes in the valence band Ev in correspondence to the quantum well layer 704 due to the potential barriers formed by the barrier layers 714.

In the band diagram of FIG. 12 corresponding to the laser diode 800 of FIG. 9B, on the other hand, it can be seen that the band structure becomes asymmetric in the direction perpendicular to the epitaxial layers of the laser diode 800 due to the elimination of the upper intermediate layer corresponding to the layer 711 of FIG. 11, and the quantum well formed in the conduction band Ec has an effective width $d_1$ generally equal to the sum of the thickness $d_a$ and the thickness $d_s$ ($d_a+d_s$), wherein the effective width $d_1$ is smaller than the effective width $d_0$ ($d_1<d_0$). Associated therewith, there is formed a quantum state $E_e'$ for electrons at an energy level higher than the energy level of the quantum state $E_e$. As the thickness $d_a$ of the quantum well layer 804 with respect to the width $d_1$ of the potential well formed in the band structure of FIG. 12 is smaller than in the case of FIG. 11 ($d_a/d_1>d_a/d_0$), the foregoing asymmetry of the quantum well potential and associated asymmetry of the wavefunction of the carriers confined in the potential well is small, and the decrease of overlap integral of the carrier probability amplitude between the conduction band Ec and the valence band Ev is minimized. In view of the fact that quantum states are formed at relatively higher energy level in the case of the laser oscillation at such a short wavelength, the effect of asymmetric potential of the intermediate layers does not appear significantly, and the problem of deterioration of efficiency of carrier recombination and associated decrease of efficiency of optical emission at the active layer is successfully avoided.

[Seventh Embodiment]

Figure 13:
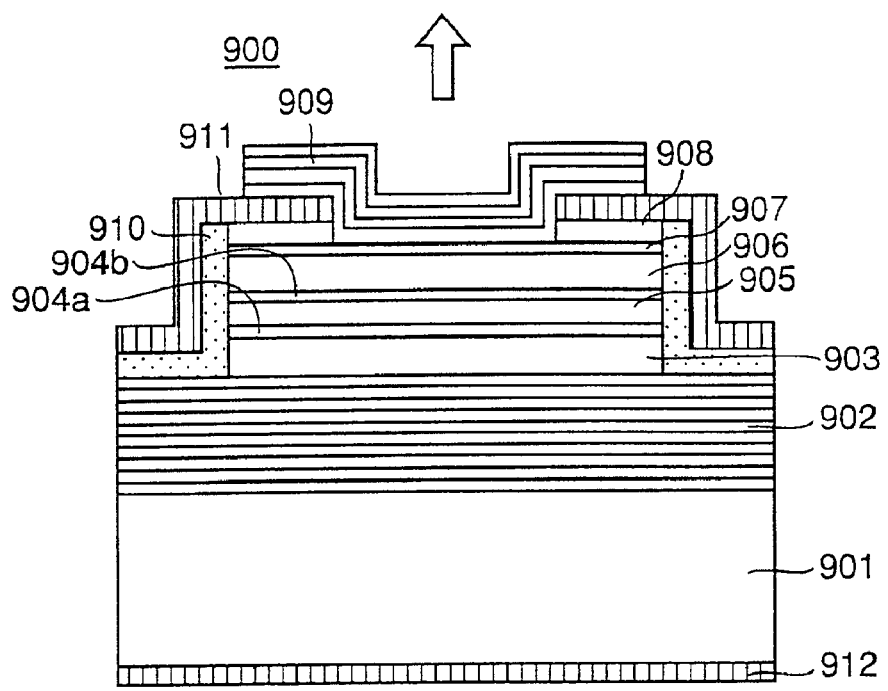
FIG. 13 is a diagram showing the construction of a laser diode according to a seventh embodiment of the present invention.

FIG. 13 shows the construction of a vertical-cavity laser diode 900 according to a seventh embodiment of the present invention, wherein the laser diode 900 can be regarded as a modification of the laser diode 500 of the third embodiment described with reference to FIG. 5.

Referring to FIG. 13, the laser diode 900 is constructed on a substrate 901 of n-type GaAs on which a multilayer reflector structure 902 is formed as a result of alternate and repetitive deposition of an n-type AlInP epitaxial layer having a composition of $Al_{0.5}In_{0.5}P$ and an n-type GaInP epitaxial layer having a composition of $Ga_{0.5}In_{0.5}P$. In an example, the AlInP layer and the GaInP layer constituting the multilayer reflector structure 902 are doped by Se with a concentration of about $3 \times 10^{17}$ cm$^{-3}$ and have a thickness of about 170 nm. The foregoing stacking structure of the AlInP layer and the GaInP layer may be repeated typically with 25 times.

On the multilayer reflector structure 902 thus formed, there is formed a lower cladding layer 903 of n-type AlGaInP epitaxially with a composition of $(Al_{0.7}Ga_{0.3})_{0.5}In_{0.5}P$, and an intermediate layer 904a of undoped GaInP having a composition of $Ga_{0.6}In_{0.4}P$ is formed further on the lower cladding layer 903 epitaxially with a thickness of typically 2 molecular layers.

On the intermediate layer 904a thus formed, there is formed an active layer 905 of undoped GaInNP epitaxially with a composition of $Ga_{0.6}In_{0.4}N_{0.01}P_{0.99}$, wherein the active layer 905 carries thereon an intermediate layer 904b of undoped GaInP with a composition of $Ga_{0.6}In_{0.4}P$, wherein the intermediate layer 904b is formed with a thickness of typically 2 molecular layers.

On the intermediate layer 904b, there is provided an upper cladding layer 906 of p-type AlGaInP epitaxially with a composition substantially identical with that of the lower cladding layer 903 except for the conductivity type, wherein the upper cladding layer 906 is covered by another intermediate layer 907 of p-type GaInP having a composition identical with the composition of the intermediate layer 904a or 904b except for the conductivity type.

On the intermediate layer 907, a contact layer 908 of p-type GaAs is formed epitaxially, wherein the epitaxial layers above the multilayer reflector structure 902 are subjected to a patterning process to form a generally cylindrical structure having a diameter of 10 μm for example and extending in the upward direction from the top surface of the multilayer reflector structure 902.

The side wall of the foregoing cylindrical structure and further the exposed top surface of the multilayer reflector structure 902 are covered by an insulation film 910 of $SiO_2$ and a p-type electrode 911 having the AuZn/Au structure is formed on the foregoing side wall insulation film 910 so as to make an ohmic contact with the top surface of the contact layer 908.

The p-type electrode 911 and the underlying contact layer 908 are then patterned to form a circular opening exposing the top surface of the intermediate layer 907, and another multilayer reflector structure 909, formed of alternate stacking of an $SiO_2$ layer and a $TiO_2$ layer each having a thickness of corresponding to a quarter wavelength of the laser oscillation wavelength, for example, is provided on the contact layer 908 in intimate contact with the exposed top surface of the intermediate layer 907. The $SiO_2$ layer and the $TiO_2$ layer constituting the multilayer reflector structure 911 may be repeated about 6 times. Further, it should be noted that an n-type electrode 912 having the AuGe/Ni/Au structure is provided on the bottom surface of the substrate 901 in ohmic contact therewith.

In the laser diode 900 of FIG. 13, the upper multilayer reflector structure 909 and the lower multilayer reflector structure 902 form together a vertical cavity and the laser diode 900 achieves stimulated emission of optical radiation at the visible wavelength band of 600 nm (0.6 μm). Thereby, the optical beam thus produced in the active layer 905 is amplified as it is reflected back and forth between the upper and lower multilayer reflector structures 909 and 902. The amplified optical beam is then emitted in the upward direction as represented in FIG. 13 by an arrow.

According to the laser diode 900 of the present embodiment that uses the active layer 905 containing therein N as a group V element, it is possible to produce a laser beam with the oscillation wavelength of 600 nm band with high efficiency and excellent temperature stability, similarly to the laser diodes of the preceding embodiments. In the laser diode 900 of the present embodiment that uses the composition of $Ga_{0.6}In_{0.4}N_{0.01}P_{0.99}$ for the active layer 905, in particular, the laser diode 900 produces the laser beam at the wavelength of about 680 nm. It should be noted that the active layer 905 of the foregoing composition, characterized by a lattice constant smaller than the lattice constant of GaAs, accumulates therein a tensile stress.

In the laser diode 900 of the present embodiment, it should be noted further that the use of the intermediate layer 907 of InGaP containing therein no substantial amount of N effectively suppresses the roughing of the surface of the layer 907 on which the upper multilayer reflection structure 909 is formed. Thereby, the problem of scattering of the optical beam at such rough surface and associated decrease of the efficiency of laser oscillation is avoided successfully. In view of the bandgap energy of the GaInP intermediate layer 907 larger than the bandgap energy of the GaInNP active layer 905, there occurs no substantial absorption in the optical radiation produced in the active layer 905.

[Eighth Embodiment]

Figure 14:
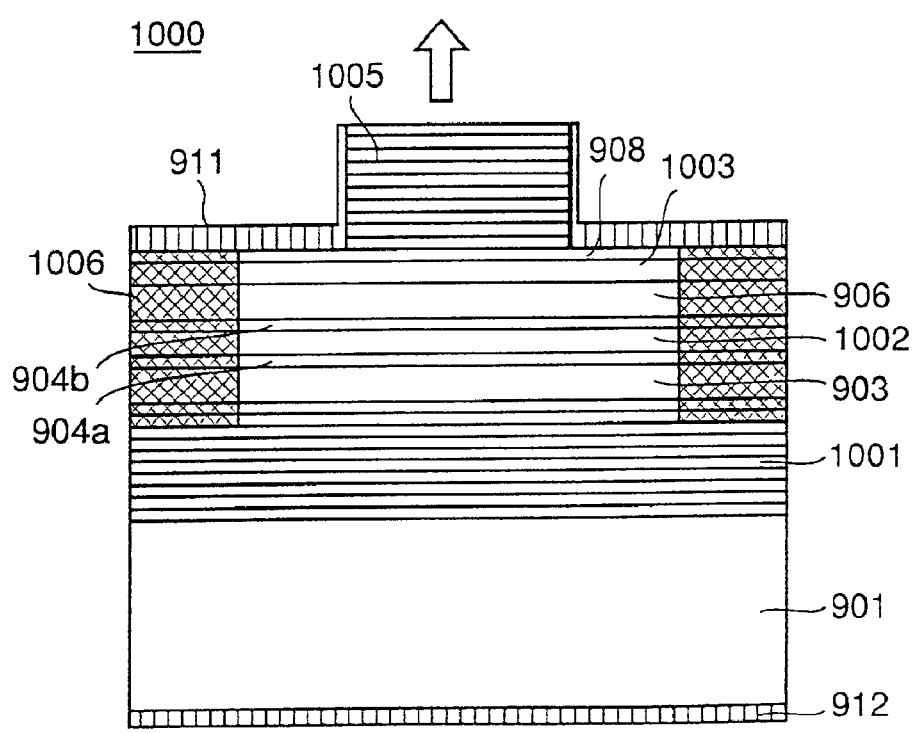
FIG. 14 is a diagram showing the construction of a laser diode according to an eighth embodiment of the present invention.

FIG. 14 shows the construction of a laser diode 1000 according to an eighth embodiment of the present invention, wherein those parts corresponding to the parts described previously are designated by the same reference numerals and the description thereof will be omitted.

In the present embodiment, the multilayer reflection structure 902 formed on the n-type GaAs active layer 901 in the laser diode 900 is now replaced by a multilayer reflection structure 1001, wherein the multilayer reflection structure 1001 includes alternate and repetitive stacking of an n-type AlGaInP epitaxial layer having a composition of $(Al_aGa_{1-a})_{0.5}In_{0.5}P$ ($0<a\leq 1$) and another n-type AlGaInP epitaxial layer having a composition of $(Al_bGa_{1-b})_{0.5}In_{0.5}P$ ($0\leq b\leq a$), wherein each of the foregoing first and second AlGaInP epitaxial layers is doped with Se and has a thickness corresponding to a quarter wavelength of the oscillation wavelength of the laser diode 1000.

In the laser diode 1000, it should further be noted that the active layer 905 of the laser diode 900 of the previous embodiment is replaced by an active layer 1002 of GaInNP, wherein the active layer 1002 has a Composition of $Ga_{0.6}In_{0.4}N_{0.005}P_{0.995}$. The active layer 905 is vertically sandwiched by the intermediate layers 904a and 904b of undoped GaInP similarly to the laser diode 900 of the previous embodiment.

The active layer 1002 thus covered by the intermediate layer 904b is covered consecutively by a layer 1003 of p-type InGaP to be described later and the contact layer 908 of p-type GaAs, and an upper multilayer reflector structure 1005 is formed on the GaAs contact layer 908, wherein the multilayer reflector structure 1005 contains therein alternate and repetitive stacking of an undoped AlGaInP epitaxial layer having a composition of $(Al_aGa_{1-a})_{0.5}In_{0.5}P$ ($0<a\leq1$) and another undoped AlGaInP epitaxial layer having a composition of $(Al_bGa_{1-b})_{0.5}In_{0.5}P$ ($0\leq b<a$). It should be noted that each of the foregoing first and second AlGaInP epitaxial layers constituting the multilayer reflection structure 1005 has a thickness corresponding to a quarter wavelength of the oscillation wavelength of the laser diode 1000.

Further, the layered structure thus formed is subjected to a patterning process to form a generally cylindrical structure in the upper reflector structure 1005 such that the cylindrical structure extends in the upward direction from the top surface of the contact layer 908 with a diameter of about 5 µm for example, and an ion implantation process of $H^+$ is conducted into the exposed part of the contact layer 908 to form a high-resistivity current confinement region 1006 of a ring-shaped form, such that the current confinement region 1006 surrounds the cylindrical upper reflector structure 1005 with a separation therefrom at the top surface of the GaAs contact layer 908 and such that the current confinement region 1006 reaches the lower multilayer reflector structure 1001 through the active layer 1002. Further, the upper p-type electrode 911 is formed on the top surface of the contact layer 908 in ohmic contact therewith at the part where the current confinement region 1006 is not formed. Similarly to the laser diode 900 of FIG. 13, the GaAs substrate 901 carries the n-type ohmic electrode 912 on the bottom surface thereof.

Similarly to the laser diode 900, there is formed a vertical cavity between the lower reflector structure 1001 and the upper reflector structure 1005 in the laser diode 1000 of FIG. 14, and there occurs a stimulated emission in the active layer 1002 as the optical beam emitted as a result of the recombination of carries in the active layer 1002 is reflected back and forth between the lower reflector structure 1001 and the upper reflector structure 1005. The optical beam thus amplified is emitted in the upward direction as indicated by arrow in FIG. 14. As a result of the formation of the ring-shaped current confinement region 1006, the injection of the carriers occurs in the limited area inside the current confinement region 1006, and the emission of optical radiation as a result of recombination of the carriers in the active layer 1002 occurs efficiently. In view of the composition of the GaInNP active layer 1002 of $Ga_{0.6}In_{0.4}N_{0.005}P_{0.995}$, the oscillation wavelength of the laser diode 1000 of FIG. 14 becomes about 650 nm. Similarly to the laser diodes of the previous embodiments, the laser diode 1000 of the present invention achieves an efficient confinement of electrons in the active layer 1002 due to the shift of the conduction band Ec in the lower energy direction caused as a result of admixing of N thereto. See the band diagram of FIG. 7. Thereby, the laser diode 1000 maintains the high efficiency of laser oscillation even in the room temperature environment.

In the laser diode 1000, it should be noted that the upper reflector structure 1005 can be formed continuously in the same deposition apparatus without interrupting the epitaxial process, contrary to the laser diode 900 of FIG. 13. In the case of the laser diode 900 of FIG. 13, it was necessary to interrupt the epitaxial process and take out the device from the deposition apparatus for dry etching, before resuming the deposition of the upper multilayer reflector structure 909. As the entire semiconductor layers are formed in the same deposition apparatus without exposure to the air, there occurs no formation of oxide on the surface of the epitaxial layers and the upper multilayer reflector structure 1005 forms the desired vertical optical cavity, together with the lower multilayer reflector structure 1001, with a predetermined cavity length. Thereby, the fabrication process of the desired vertical cavity laser diode is substantially facilitated by using the structure of FIG. 14.

In the laser diode 1000 of FIG. 14, it should be noted that the p-type GaInP layer 1003 has a composition of $Ga_{0.6}In_{0.4}P$ and effectively reduces the spike in the valence band formed in correspondence to the heterojunction interface between the cladding layer 906 of p-type AlGaInP and the contact layer 908 of p-type GaAs. Thereby, the efficiency of hole injection from the upper, p-type electrode 911 is facilitated substantially. Further, the layer 1003 contributes to the diffusion of the holes injected from the electrode 911 such that the holes are injected uniformly to the cylindrical region of the semiconductor layered structure defined by the ring-shaped current confinement region 1006. As the GaInP intermediate layer 1003 has a bandgap larger than the bandgap of the GaInNP active layer 1003, there occurs no substantial absorption of the optical beam produced by the recombination of carriers taking place in the active layer 1002. As the GaInP Intermediate layer 1003 of the foregoing composition does not achieve a lattice matching with the GaAs substrate 901, the thickness of the layer 1003 is set to about 10 nm such that the thickness of the layer 1003 does not exceed the critical thickness thereof.

In the laser diode 1000 of FIG. 14, it should further be noted that the contact layer 908 of p-type GaAs absorbs the optical radiation emitted in the active layer 1002 of GaInNP as a result of the carrier recombination. Thus, the laser diode 1000 reduces the thickness of the contact layer 908 to about 5 nm so that the effect of the optical absorption is minimized.

Similarly to the laser diode of the previous embodiments, the laser diode 1000 of the present embodiment also avoids the deterioration of crystal quality or laser oscillation efficiency, by sandwiching the GaInNP active layer 1002 by the GaInP intermediate layers 904a and 904b.

[Ninth Embodiment]

Figure 15:
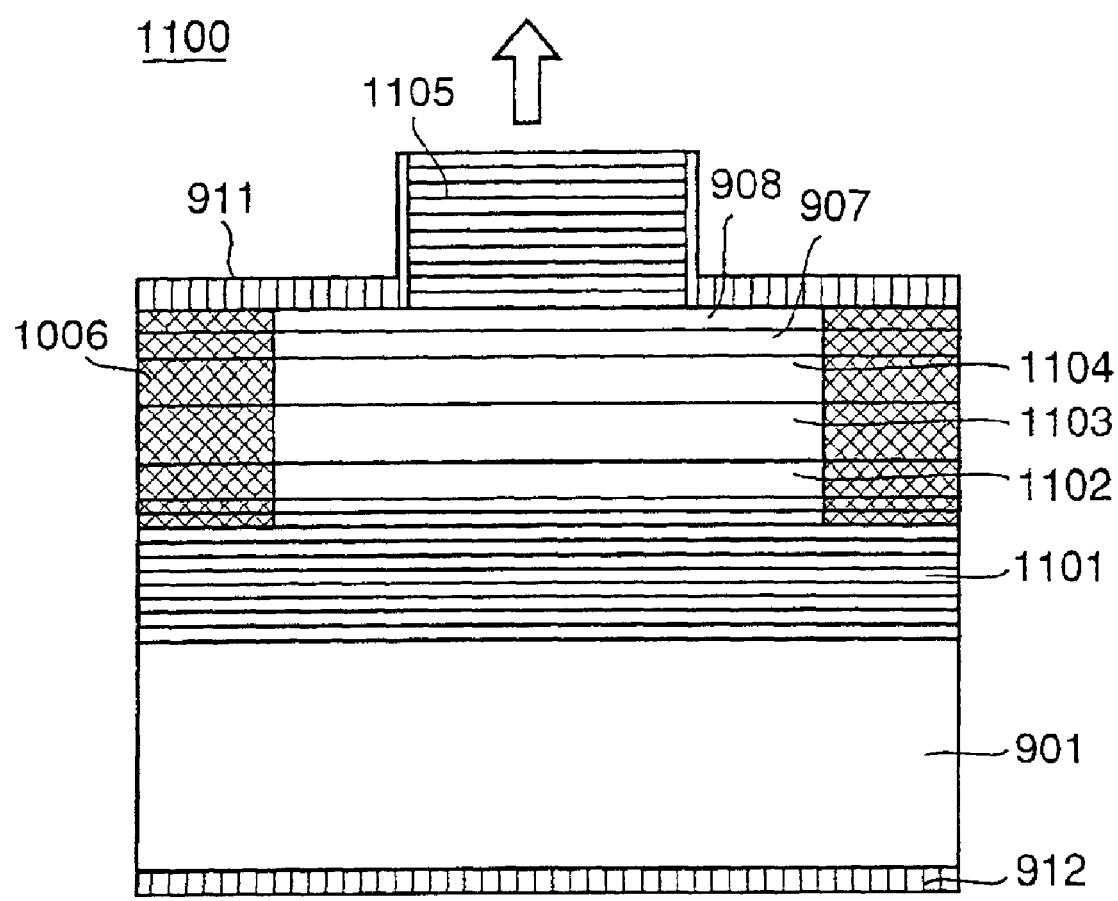
FIG. 15 is a diagram showing the construction of a laser diode according to a ninth embodiment of the present invention.

FIG. 15 shows the construction of a vertical-cavity laser diode 1100 according to a ninth embodiment of the present invention, wherein those parts corresponding to the parts described previously are designated by the same reference numerals and the description thereof will be omitted.

Referring to FIG. 15, the laser diode 1100 has a construction similar to that of the laser diode 1000 of FIG. 14, except that the lower multilayer reflector structure 1001 is replaced with a multilayer reflector structure 1101 including therein alternate and repetitive stacking of a low refractive epitaxial layer of n-type and a high refractive epitaxial layer of n-type each having a thickness corresponding to a quarter-wavelength of the laser oscillation wavelength. It should be noted that the low refractive layer is typically formed of $Al_{0.5}In_{0.5}P$ doped with Se, while the high refractive layer is formed of a stacking of a Se-doped $Ga_{0.5}In_{0.5}P$ having a thickness of 4.5 nm a Se-doped $Al_{0.5}In_{0.5}P$ having a thickness of 1.5 nm. The foregoing high refractive epitaxial layer and the low refractive epitaxial layer are repeated about 25 times and form a super-lattice structure that constitutes the lower reflector structure 1101. Thereby, the super-lattice structure thus formed has an effective bandgap generally corresponding to that of the AlGaInP mixed crystal having a composition of $(Al_{0.1}Ga_{0.9})_{0.5}In_{0.5}P$. Further, the laser diode 1100 of the present embodiment uses an upper reflector structure 1105 in place of the upper reflector structure 1005 of FIG. 14, wherein it should be noted that the upper reflector structure 1105 has a similar super-lattice structure except that the epitaxial layers are not doped and that the high refractive epitaxial layer and the low refractive epitaxial layer are repeated 20 times.

Further, the laser diode 1100 uses an active layer 1103 having an MQW structure in combination with an n-type lower cladding layer 1102 of AlGaInP and a p-type upper cladding layer 1104 both having a composition of $Al_{0.5}Ga_{0.5}P$. Further, the GaInP layer 1003 used in the laser diode 1000 of FIG. 14 is replaced with the GaInP layer 907 of the composition $Ga_{0.5}In_{0.5}P$, which is used in the laser diode 900 of FIG. 13.

Figure 16A:
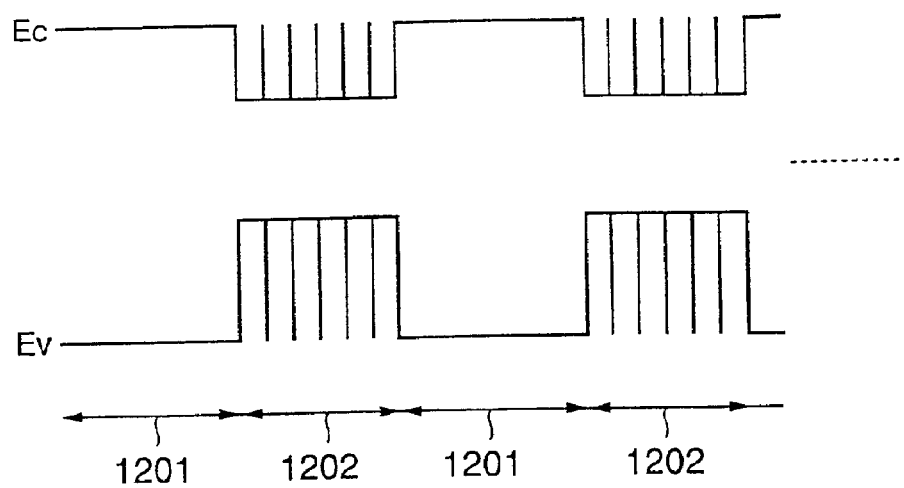
FIGS. 16A and 16B show the band structure of the laser diode of FIG. 15.

FIG. 16A shows the band structure of the lower multilayer reflector structure 1101 taken in the direction perpendicular to the epitaxial layers.

Referring to FIG. 16A, it can be seen that the multilayer reflector structure 1101 includes an alternate repetition of a low refractive layer 1201 of AlInP doped with Se and having the composition of $Al_{0.5}In_{0.5}P$ and a high refractive layer 1202 provided adjacent to the layer 1201, wherein the high refractive layer 1202 is formed of a stacking of a GaInP layer having the composition of $Ga_{0.5}In_{0.5}P$ and doped with Se and an AlInP layer doped also with Se and having the composition of $Al_{0.5}In_{0.5}P$ as noted previously. The GaInP layer has a thickness of 4.5 nm in the high refractive layer 1202 while the AlInP has a thickness of 1.5 nm in the high refractive layer 1202. A similar band structure exists also in the upper multilayer reflector structure 1105 except that the epitaxial layers therein are substantially free from doping.

Figure 16B:
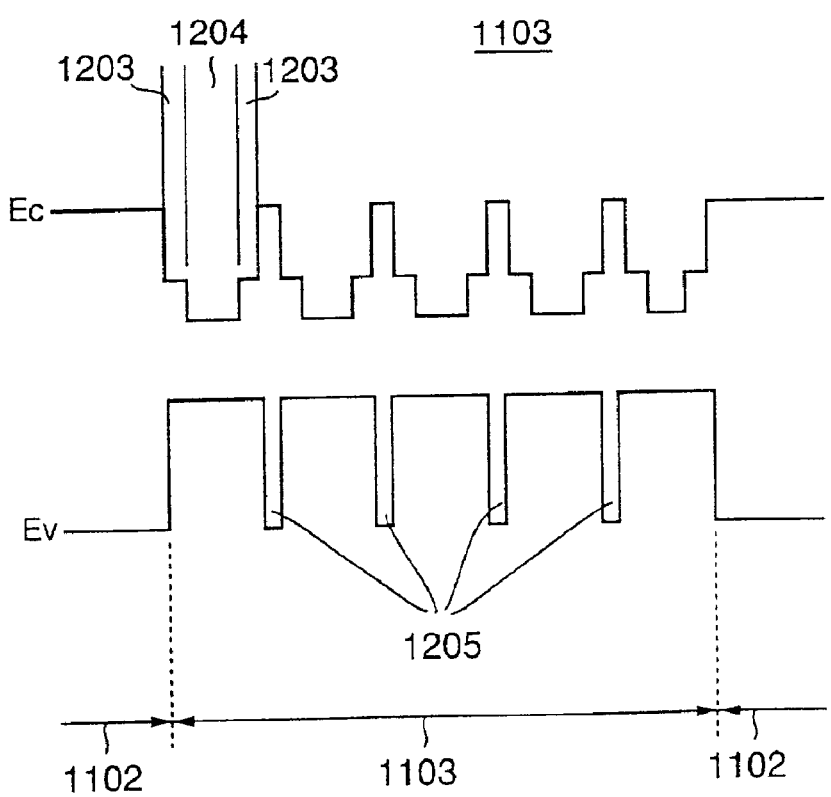

FIG. 16B shows the band diagram of the MQW structure forming the active layer 1103.

Referring to FIG. 16B, the active layer 1103 includes alienate and repetitive stacking of a barrier layer 1205 of undoped AlInP having the composition of $Al_{0.5}In_{0.5}P$ and a quantum well layer 1204 of undoped GaInNP having the composition of $Ga_{0.5}In_{0.5}N_{0.005}P_{0.995}$, wherein each of the barrier layer 1205 and the quantum well layer 1204 has a thickness of 3 nm. Further, it should be noted that there is interposed an intermediate layer 1203 of undoped GaInP having the composition of $Ga_{0.5}In_{0.5}P$ at the upper and lower surfaces of each quantum well layer 1204 in direct and intimate contact therewith, such that the intermediate layers 1203 sandwich therebetween the quantum well layer 1204.

As can be seen in the band diagram of FIG. 16B, the conduction band Ec and the valence band Ev of the GaInNP quantum well layer 1204 are shifted in the lower energy direction with respect to those of the GaInP intermediate layer 1203 as a result of the admixing of N as a group V element, wherein the quantum well layer 1204 having such a composition produces an optical radiation with the wavelength of 650 nm. As a result of the shifting of the conduction band Ec for the quantum well layer 1204, there occurs an excellent confinement of electrons in the quantum well layer and the problem of overflowing of thermally excited electrons from the quantum well layer is successfully suppressed. Thereby, the laser diode of the present embodiment provides the feature of efficient layer oscillation even in the room temperature environment.

By using the intermediate layers 1203 in the MQW structure of the active layer 1103, epitaxial growth of a high-quality crystal layer is guaranteed for the quantum well layer 1204 that contains N as the group V element, even when the quantum well layer 1204 is used in combination with the barrier layer 1205 that contains Al. Further, the quantum well layer 1204 thus grown on the Al-free intermediate layer 1203 has a smooth, mirror-flat surface.

It should be noted that the foregoing formation of the super-lattice structure in the multilayer reflector structure 1101 or 1105 or the formation of the MQW structure 1103 is achieved easily by interrupting or switching the supply of the gaseous source materials, while such a interruption or switching of the source material is conducted by merely controlling the valve used for supplying the gaseous source material in a MOCVD apparatus or the shutter of an MBE apparatus.

[Tenth Embodiment]

Figure 17:
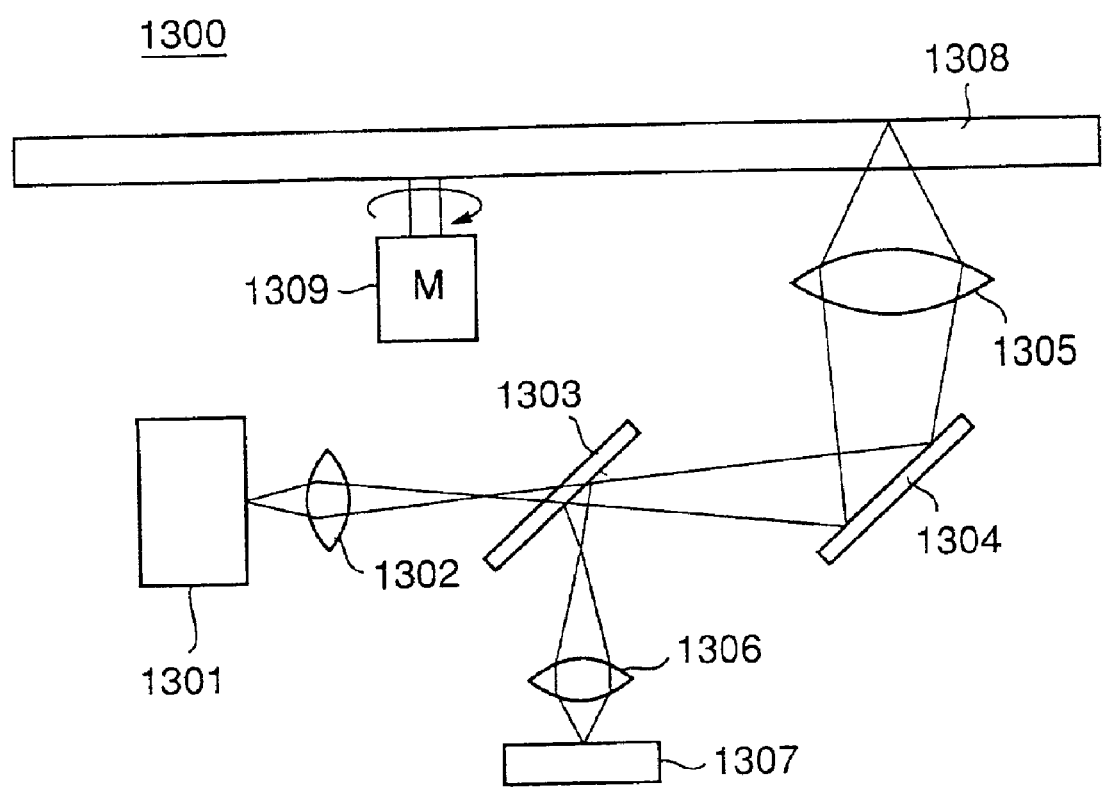
FIG. 17 is a diagram showing the construction of an optical disk drive according to a tenth embodiment of the present invention.

FIG. 17 shows the construction of an optical disk drive 1300 according to a tenth embodiment of the present invention.

Referring to FIG. 17, the optical disk drive 1300 includes a spindle motor 1309 rotating an optical disk 1308 mounted thereon detachably, wherein the optical disk drive 1300 further includes a vertical-cavity laser diode 1301 that emits an optical beam in the wavelength band of 0.6 $\mu$m in the direction perpendicular to the epitaxial layers forming the laser diode 1301. The laser beam thus emitted is collimated by a lens 1302 and is directed to a scanning mirror 1304 via an optical beam splitter 1303. The scanning mirror 1304 in turn focuses the laser beam supplied thereto at a desired location of the optical disk 1308 via an objective lens 1305. By driving the scanning mirror 1304, the optical beam spot of the laser beam scans over the recording surface of the optical disk 1308.

Further, the optical disk drive 1300 includes a photodetector 1307 for detecting the laser beam reflected by the optical disk 1308, wherein the laser beam reflected by the optical disk 1308 is directed to the photodetector 1307 via the optical beam splitter 1303 and a lens 1306.

In the optical disk drive 1300 of the foregoing construction, it is possible to achieve a reliable read/write operation by using the laser diode of any of the preceding embodiments for the laser diode 1301, without using a cooling system or temperature regulation system.

[Eleventh Embodiment]

Figure 18:
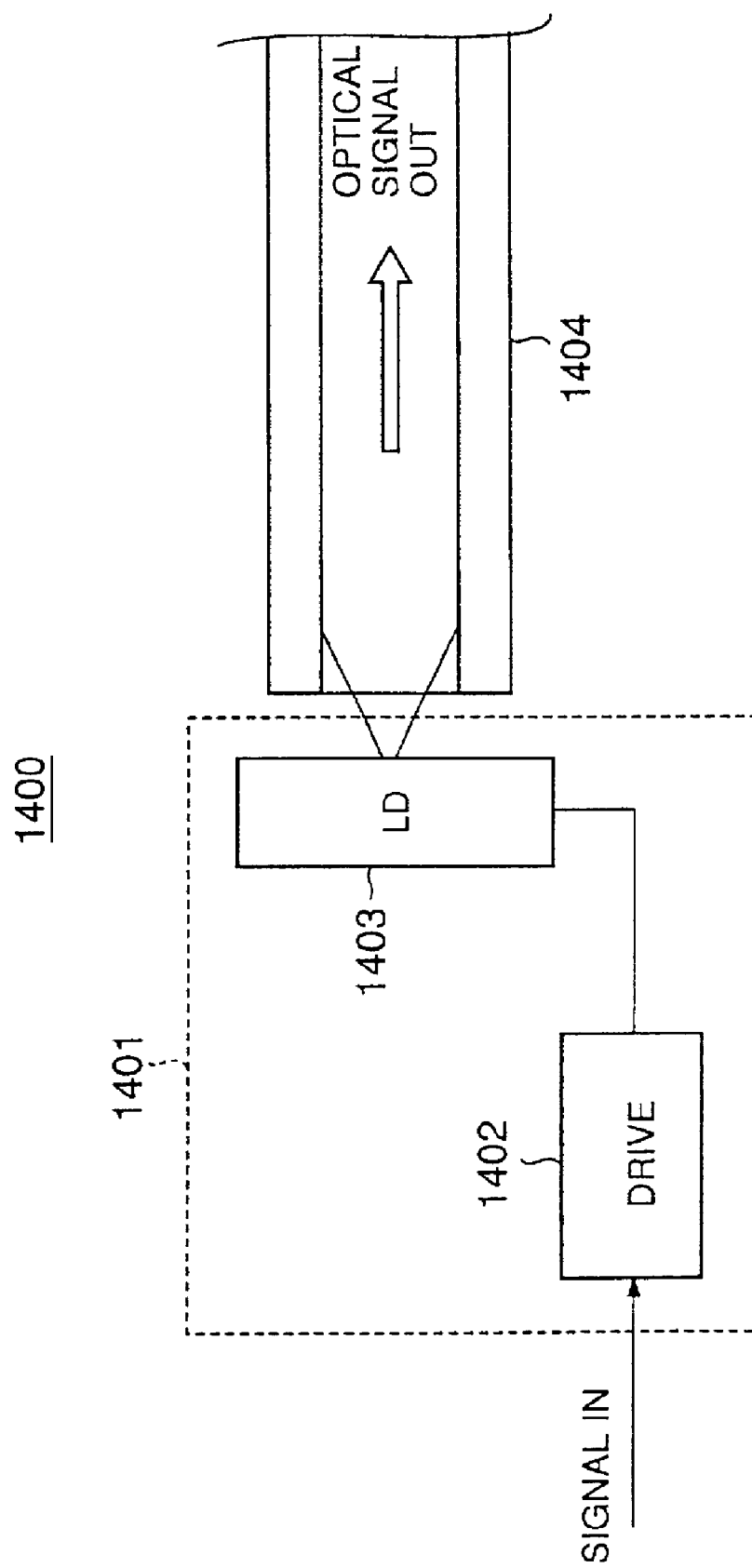
FIG. 18 is a diagram showing the construction of an optical transmission system according to an eleventh embodiment of the present invention.

FIG. 18 shows the construction of an optical transmission system 1400 according to an eleventh embodiment of the present invention.

Referring to FIG. 18, the optical transmission system 1400 of the present embodiment includes an optical transmitter 1401, wherein the optical transmitter 1401 includes a drive circuit 1402 supplied with an electrical signal and a vertical-cavity laser diode 1403, wherein the vertical-cavity laser diode 1403 is driven by a driving signal produced by the drive circuit 1402 in response to the electrical signal supplied to the drive circuit 1402. Further, it should be noted that the laser diode 1403 is coupled optically to a plastic optical fiber 1404 having a transmission band of 0.6 $\mu$m and the optical beam emitted by the laser diode 1403 is effectively injected into the core of the optical fiber 1404.

In the optical transmission system 1400 of the present embodiment, it should be noted the optical transmitter 1401 operates efficiently and with reliability by using any of the vertical cavity laser diodes 900–1100 described with reference to FIGS. 13–15. The use of the laser diodes 900–1100 of the present invention is particularly preferably in view of the oscillation wavelength thereof of 0.6 $\mu$m band coincident to the transmission band of a plastic optical fiber.

[Twelfth Embodiment]

As explained previously with reference to the band diagram of FIG. 7 or with reference to the band diagrams of FIGS. 11 and 12, the use of the GaInNP layer for the active layer in combination with the intermediate layer of GaInP causes a shifting in energy for the conduction band and valence band of the GaInNP active layer in the lower energy direction with respect to the intermediate layer, and there tends to appear a staggered, type-II heterojunction at the interface between the intermediate layer and the active layer as represented in FIG. 19A, which is similar to the band diagram of FIG. 7.

While such a type-II heterojunction may be useful for confining electrons in the active layer, such a structure is not suitable for confinement of holes in the active layer. In fact, the holes are not confined in the active layer as long as the staggered band structure of FIG. 19A is used, and it has been necessary to provide an outer potential well outside the intermediate layer of GaInP in the laser diode of previous embodiments for achieving the confinement of the holes necessary for the operation of the laser diode. In such a case, however, the overlap integral of the carrier wavefunction between the conduction band and the valence band is tend to be reduced and the efficiency of optical radiation of the laser diode is tend to be deteriorated. It is desired that the carrier confinement occurs in the active layer similarly for the electrons and for the holes.

On the other hand, it is known that the band structure of a III-V compound semiconductor material changes when a stress is applied as represented in FIG. 19B or FIG. 19C, wherein it should be noted that FIG. 19B represents the case in which a compressive stress is applied to the material system in which a GaInNP layer is sandwiched by a pair of GaInP layers, while FIG. 19C represents the case in which a tensile stress is applied to the same material system. In the band structure of FIG. 19B, it can be seen that the valence band Ev becomes substantially flat at the heterojunction interface between the GaInP layer and the GaInNP layer while simultaneously maintaining a large band discontinuity in the conduction band Ec in correspondence to the foregoing heterojunction interface. In the case of FIG. 19C, on the other hand, the magnitude of band discontinuity at the conduction band Ec is reduced while the bump of the conduction band Ev is not eliminated.

In the laser diode, it is preferable to form a type-I heterojunction at the interface between the GaInNP active layer and the adjacent intermediate layers of GaInP as represented in FIG. 19D, wherein it should be noted that the magnitude of shift of the conduction band Ec or valence band Ev can be evaluated by the strong coupling theory of Harrison according to the relationship $\Delta Ec = -2a\{(c_{11}-c_{12})/c_{11}\}\epsilon$, and $\Delta Ec = 2a'\{(c_{11}-c_{12})/c_{11}\}\epsilon + b\{(c_{11}+c_{12})/c_{11}\}\epsilon$, wherein $c_{11}$ and $c_{12}$ represent the lattice constant, a represents the hydrostatic deformation potential of the conduction band Ec, a' represents the hydrostatic deformation potential of the valence band Ev, b represents an axial deformation potential, while $\epsilon$ represents a lattice strain. About the strong coupling theory of Harrison, reference should be made to Appl. Phys. Lett. vol.60, no.5, pp.630–632, 1992.

FIG. 20A shows the calculated change of the valence band energy Ev and the conduction band energy Ec under a compressive stress by decreasing the Ga content x below the lattice matching composition of x=0.52, while FIG. 20B shows the change of the valence band energy Ev and the conduction band energy Ec under a tensile stress. In the calculation of FIG. 20B, the Ga content x is increased beyond the foregoing lattice matching composition.

The result of FIGS. 20A and 20B indicates that the bottom edge of the valence band Ev can be shifted in the direction of higher energy side by increasing the Ga content x in the GaInNP active layer. By adjusting the amount x of Ga in the GaInNP active layer, it is possible to eliminate the foregoing bump of the valence band as represented in the band diagram of FIG. 19D. In FIG. 19D, it should be noted that $\Delta E_v$ represents the shift of the valence band energy Ev caused as a result of change in the Ga content x in the GaInNP mixed crystal, $\Delta E_{strain}$ represents the foregoing shift of the valence band energy Ev caused as a strain in the GaInNP mixed crystal forming the active layer, and $\Delta E_N$ represents shift of the valence band energy Ev caused as a result of incorporation of N in to the GaInNP mixed crystal. In order to achieve the foregoing elimination of the valence band Ev in the GaInP active layer, it is necessary that the foregoing relationship holds between the quantities $E_N$, $\Delta E_{strain}$ and $\Delta E_v$ as $\Delta E_N + \Delta E_{strain} + \Delta E_v > 0$.

The band diagram of FIG. 19D represents the so-called type-I heterojunction, which is advantageous for efficient recombination of carriers, as both the electrons and the holes are accumulated in respective potential wells formed in the conduction band Ec or the valence band Ev of the GaInNP active layer.

In FIG. 20B, it can be seen that the increase of the Ga content x in the GaInNP layer also causes an increase in the conduction band energy Ec. However, the magnitude of shift of the conduction band energy Ec, caused as a result of increase of the Ga content x beyond the lattice matching composition, is substantially smaller than the foregoing shift $\Delta E_{strain}$, and the effective confinement of the electrons in the conduction band is maintained even when the GaInNP active layer is thus strained by a tensile stress.

FIG. 19E shows another principle of modifying the type-II heterojunction of FIG. 19A to a type-I heterojunction, wherein FIG. 19E achieves the desired modification of the band structure by introducing a p-type dopant into the active layer of GaInNP. As a result of such a p-type doping, there occurs a relative shift of the Fermi level $E_{fp}$ of the GaInNP active layer in the lower energy side with respect to the conduction band Ec or the valence band Ev thereof, while such a relative shift of the Fermi level $E_{fp}$ in the lower energy side inside the GaInNP active layer causes, in turn, an overall shifting of the conduction band Ec and the valence band Ec of the active layer in the higher energy side with respect to the conduction band Ec or the valence band Ev of the adjacent GaInP optical waveguide layer or cladding layer. In the equilibrium state, it should be noted that the Fermi energy level $E_{fp}$ of the GaInNP active layer has to coincide with the Fermi energy level of the adjacent GaInP optical waveguide layer of cladding layer.

As a result of such an overall shifting of the band diagram of the GaInNP active layer with respect to the GaInP optical waveguide layer or cladding layer, the type-II heterojunction of FIG. 19A is successfully modified to the type-I heterojunction represented in FIG. 19E. Thereby, an excellent carrier confinement is guaranteed in the GaInNP active layer for both the electrons and holes, and the efficiency of the laser diode is improved.

A similar relative shifting of the Fermi energy level occurs also when the GaInP intermediate layer is doped with an n-type dopant. In the case of doping the GaInP intermediate layer by a p-type dopant, there occurs a shifting of the Fermi energy level $E_{fn}$ in the higher energy side with respect to the conduction band Ec and the valence band Ev, and the band structure of the GaInP intermediate layer thus doped is shifted as a whole in the lower energy side with respect to the GaInNP active layer, which is now free from doping. Thereby, there appears a band structure represented in FIG. 19F, wherein there is formed a type-I heterojunction at the interface between the n-type GaInP intermediate layer and the undoped GaInNP active layer. In the example of FIG. 19F, the opposite intermediate layer of GaInP is not doped, and there is formed a type-II heterojunction at the interface between the active layer of GaInNP and the intermediate layer of undoped GaInP similarly to the case of FIG. 19A.

Figure 21:
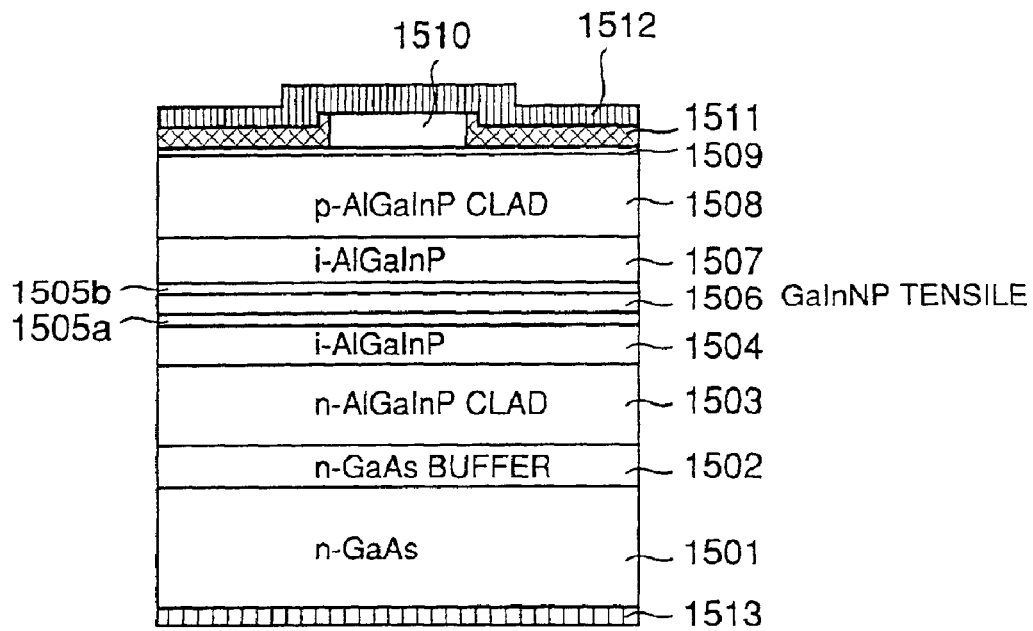
FIG. 21 is a diagram showing the construction of a laser diode according to the twelfth embodiment of the present invention.

FIG. 21 shows the construction of a SCH-type laser diode 1500 according to a twelfth embodiment of the present invention.

Referring to FIG. 21, the laser diode 1500 is constructed on a substrate 1501 of n-type GaAs covered by a buffer layer 1502 of n-type GaAs grown epitaxially on the substrate 1501 and includes a lower cladding layer 1503 of n-type AlGaInP and a lower optical guide layer 1504 of undoped AlGaInP, wherein the lower cladding layer 1503 and the lower optical waveguide layer 1504 are grown epitaxially and consecutively on the buffer layer 1502 by an MOCVD process with respective thicknesses of 1 μm and 0.1 μm and respective compositions of $(Al_{0.7}Ga_{0.3})_{0.5}In_{0.5}P$ and $(Al_{0.5}Ga_{0.5})_{0.5}In_{0.5}P$.

On the lower optical waveguide layer 1504, there is formed a lower intermediate layer 1505a of undoped GaInP having a composition of $Ga_{0.5}In_{0.5}P$ with a thickness of about 2 nm, and an active layer 1506 of undoped GaInNP having a composition of $Ga_{0.6}In_{0.4}N_{0.01}P_{0.99}$ is formed further on the lower intermediate layer 1505a with a thickness of about 30 nm. Further, an upper intermediate layer 1505b of undoped GaInP having a composition substantially the same as the composition of the lower intermediate layer 1505a is formed epitaxially on the active layer 1506 with a thickness of about 2 nm, and an upper optical waveguide layer 1507 of undoped AlGaInP having a composition of $(Al_{0.5}Ga_{0.5})_{0.5}In_{0.5}P$ is further formed epitaxially on the upper intermediate layer 1505a with a thickness of about 0.1 μm.

Further, an upper cladding layer 1508 of n-type AlGaInP having a composition of $(Al_{0.7}Ga_{0.3})_{0.5}In_{0.5}P$ is grown epitaxially on the upper optical waveguide layer 1507 with a thickness of about 1 μm, and a contact layer 1510 of p-type GaAs is formed epitaxially on the upper cladding layer 1508 with a thickness of about 0.5 nm, with an anti-spike layer 1509 of p-type GaInP having a composition of $Ga_{0.5}In_{0.5}P$ interposed between the upper cladding layer 1508 and the contact layer 1510 with a thickness of about 50 nm.

The contact layer 1510 is patterned to form a stripe pattern extending in the longitudinal direction of the laser diode 1500 on the anti-spike layer 1509, while the anti-spike layer 1509 is covered, at both lateral sides of the contact layer 1510, by a pair of insulation patterns 1511 of $SiO_2$. Further, a p-type electrode 1512 is deposited on the insulation patterns 1511 including the exposed contact layer 1510, wherein the electrode 1512 achieves an ohmic contact with the contact layer 1510. Further, an n-type electrode 1513 is formed on the bottom surface of the substrate 1501 in ohmic contact therewith.

In the laser diode 1500 of the present embodiment, it should be noted that the active layer 1506 contains N and the efficiency of electron confinement in the potential well formed in the conduction band in correspondence to the active layer 1506 is improved substantially. It should be noted that there is formed a band discontinuity of about 80 meV in the bottom edge of the conduction band at the interface between the active layer 1506 and the adjacent intermediate layer 1505a or 1505b as a result of incorporation of N into the active layer 1506.

On the other hand, such a mere incorporation of N into active layer 1506 leads to the formation of the type-II band structure shown in FIG. 19A at the heterojunction interface between the active layer 1506 and the adjacent intermediate layer 1505a or 1505b as noted previously. Thus, the present invention modifies the Ga content in the active layer 1506 such that the active layer 1506 is no longer satisfies the lattice matching with respect to the GaAs substrate 1501. More specifically, the foregoing composition of $Ga_{0.6}In_{0.4}N_{0.01}P_{0.99}$ for the GaInNP active layer 1506 causes an accumulation of tensile strain of about 0.6% therein, and there occurs a shifting in the valence band energy Ev of the GaInNP active layer 1506 in the higher energy side with respect to the GaInP intermediate layers 1505a and 1505b locating adjacent to the active layer 1505 as a result of the tensile strain thus induced. In the foregoing example, the energy shift $(\Delta E_v + \Delta E_{strain})$ caused by the increase in the Ga content x $(\Delta E_v)$ in the GaInNP active layer 1506 including the effect of strain $\Delta E_{strain}$, has a magnitude of about 34 meV, while this shift $(\Delta E_v + \Delta E_{strain})$ of the valence band energy of the GaInNP active layer 1506 in the higher energy side successfully compensates for the shift $(\Delta E_N)$ of the valence band energy in the lower energy side of about 0.18 meV caused by the admixing of N. Thereby, there holds the relationship $$\Delta E_N + \Delta E_{strain} + \Delta E_v > 0,$$

and the active layer 1506 thus strained successfully realizes the type-I heterojunction at the interface between the active layer 1506 and the intermediate layer 1505a or 1505b.

In the embodiment of FIG. 21, it should be noted that the upper and lower intermediate layers 1505a and 1505b have a lattice matching composition with respect to the GaAs substrate 1501. By using the intermediate layers 1505a and 1505b, which are free from N, between the N-containing active layer 1506 and the optical waveguide layer 1504 or 1507 that contains Al, similarly to the laser diodes of the preceding embodiments, the active layer 1506 has an excellent quality and the efficiency of the laser oscillation is improved further.

[Thirteenth Embodiment]

Figure 22:
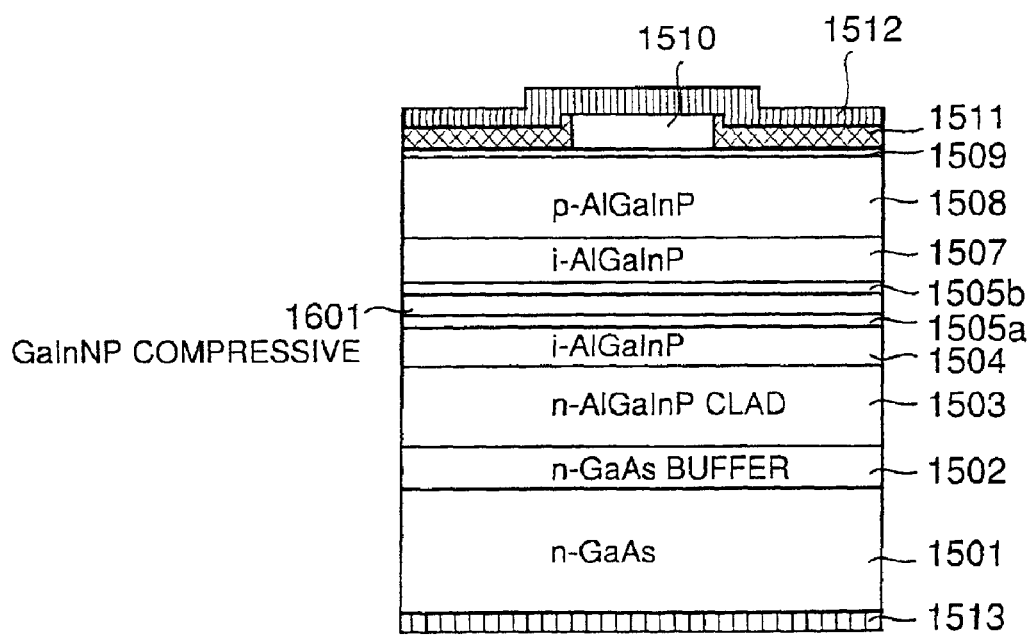
FIG. 22 is a diagram showing the construction of a laser diode according to a thirteenth embodiment of the present invention.

FIG. 22 shows the construction of an SCH laser diode 1600 according to a thirteenth embodiment of the present invention, wherein those parts corresponding to the parts described previously are designated by the same reference numerals and the description thereof will be omitted.

Referring to FIG. 22, the laser diode 1600 has a construction similar to that of the laser diode 1500 except that the active layer 1506 of the laser diode 1500 is now replaced by an active layer 1601 of GaInNP having a composition of $Ga_{0.45}In_{0.55}N_{0.01}P_{0.99}$. It should be noted that the foregoing composition of the active layer 1601 is not a lattice matching composition with respect to the GaAs substrate 1501 and there is introduced a compressive strain of about 0.5%.

In response to the introduction of N, there occurs a decrease in the bandgap in the GaInNP active layer 1601 of as much as about 150 meV, wherein it should be noted that there further occurs a shift in the bottom edge of the valence band Ev in the lower energy side with the magnitude of about 18 meV, similarly to the embodiment of FIG. 21. Thereby, there is formed a type-II heterojunction represented in FIG. 19A at the interface between the active layer 1601 and the adjacent intermediate layer 1505a or 1505b, also similarly to the embodiment of FIG. 21.

In the present embodiment, on the other hand, the foregoing shift of the bottom edge of the valence band Ev is successfully compensated for by the compressive strain of about 0.5%. It should be noted that the foregoing compressive strain causes a shift in the bottom edge of the valence band with a magnitude of about 33 meV in the higher energy side at the foregoing composition of $Ga_{0.45}In_{0.55}P$, as compared with the GaInP mixed crystal of the lattice matching composition of $Ga_{0.5}In_{0.5}P$. See the relationship of FIG. 20A. Thereby, the valence band Ev of the GaInNP active layer 1601 is located at the higher energy side as compared with the valence band Ev of the adjacent intermediate layer 1505a or 1505b.

As the conduction band Ec of the active layer 1601 is located at the lower energy side with respect to the conduction band of the intermediate layer 1505a or 1505b, the type-II heterojunction of FIG. 19A is successfully modified to the type-I as represented in FIG. 19D, and the laser diode 1600 oscillates with excellent efficiency and stability.

[Fourteenth Embodiment]

Figure 23:
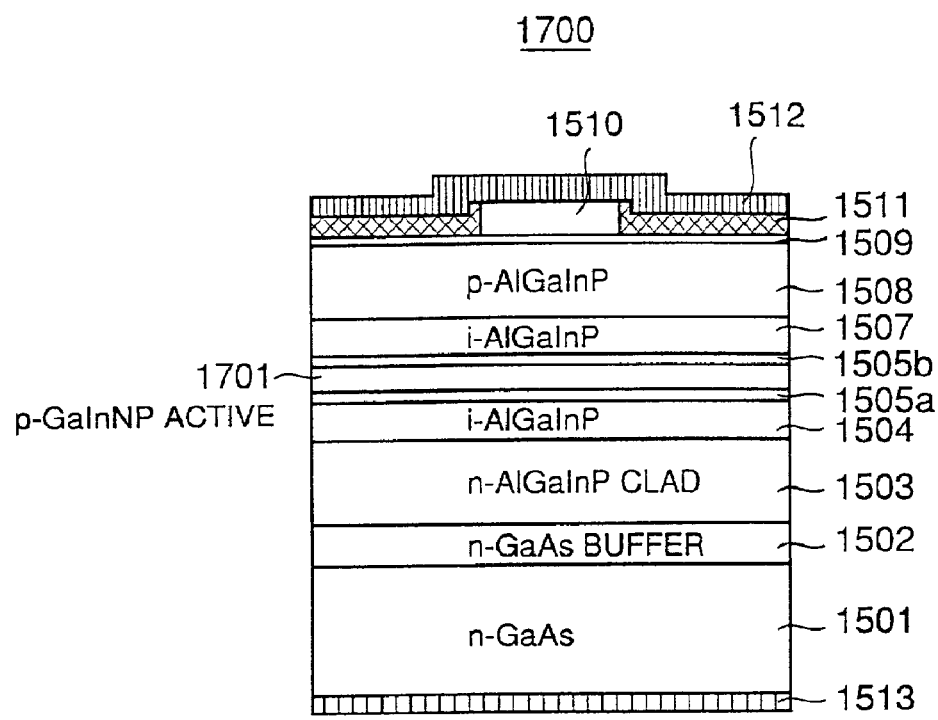
FIG. 23 is a diagram showing the construction of a laser diode according to a fourteenth embodiment of the present invention.

FIG. 23 shows the construction of a SCH laser diode 1700 according to a fourteenth embodiment of the present invention, wherein those parts corresponding to the parts described previously are designated by the same reference numerals and the description thereof will be omitted.

Referring to FIG. 23, the laser diode 1700 has a construction similar to that of the laser diode 1500 except that the active layer 1506 of the laser diode 1500 is now replaced by an active layer 1701 of GaInNP having a lattice matching composition of $Ga_{0.5}In_{0.5}N_{0.01}P_{0.99}$ and doped to the p-type by Mg with a concentration level of $2\times10^{18}$ $cm^{-3}$. The active layer 1701 may have a thickness of about 30 nm.

In response to the introduction of N, there occurs a decrease in the bandgap in the GaInNP active layer 1701 of as much as about 150 meV similarly to the preceding embodiments. Further, the energy level of the valence band is shifted in the lower energy side also in the active layer 1701, and there is formed a type-II heterojunction at the interface between the GaInNP active layer 1701 and the adjacent intermediate layer 1505a and 1505b.

In the present embodiment, on the other hand, the foregoing shift of the bottom edge of the valence band Ev is successfully compensated for by the overall shift of the band structure in the higher energy side caused for the GaInNP active layer 1701 as a result of doping of the same to the p-type, as explained before with reference to FIG. 19E. As a result of such a shifting of the overall band structure including the conduction band Ec and the valence band Ev, the valence band Ev of the GaInNP active layer 1701 is located at the higher energy side as compared with the valence band Ev of the adjacent intermediate layer 1505a or 1505b.

As the conduction band Ec of the active layer 1701 is located still at the lower energy side with respect to the conduction band of the intermediate layer 1505a or 1505b, even after the doping of the active layer 1701 to the p-type, the type-II heterojunction of FIG. 19A is successfully modified to the type-I as represented in FIG. 19E, and the laser diode 1700 oscillates with excellent efficiency and stability.

[Fifteenth Embodiment]

Figure 24:
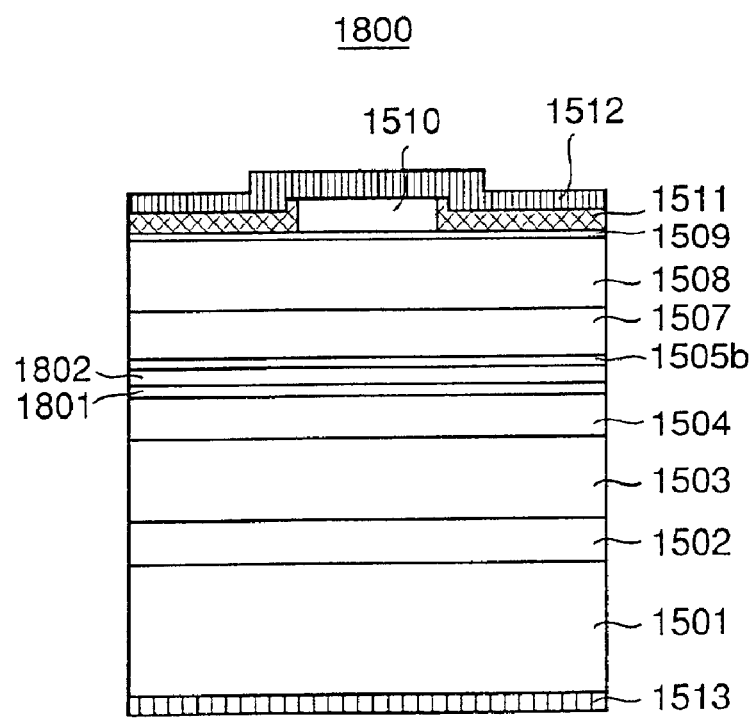
FIG. 24 is a diagram showing the construction of a laser diode according to a fifteenth embodiment of the present invention.

FIG. 24 shows the construction of a SCH laser diode 1800 according to a fourteenth embodiment of the present invention, wherein those parts corresponding to the parts described previously are designated by the same reference numerals and the description thereof will be omitted.

Referring to FIG. 24, the laser diode 1800 has a construction similar to that of the laser diode 1500 except that the lower intermediate layer 1505a of the laser diode 1500 is replaced by an intermediate layer 1801 of n-type GaInP having a thickness of 2 nm and doped with Se to a concentration level of $5\times10^{18}$ $cm^{-3}$ and that the active layer 1506 is replaced by an active layer 1801 of undoped GaInNP having a lattice matching composition of $Ga_{0.5}In_{0.5}N_{0.01}P_{0.99}$. The active layer 1802 may have a thickness of 30 nm.

In the laser diode 1800, too, there occurs a decrease in the bandgap in the GaInNP active layer 1801 in response to the introduction of N thereto, of as much as about 150 meV similarly to the preceding embodiments. Further, the energy level of the valence band is shifted in the lower energy side also in the active layer 1802, and there is formed a type-II heterojunction at the interface between the GaInNP active layer 1802 and the adjacent intermediate layer 1505b.

In the present embodiment, on the other hand, the lower intermediate layer 1801 is doped to the n-type and the band structure of the intermediate layer 1801 is shifted in the lower energy side with respect to the undoped GaInNP active layer 1802, as explained already with reference to FIG. 19F.

Thereby, there is formed a type-I heterojunction at the interface between the active layer 1802 and the underlying intermediate layer 1801, and there occurs an effective blocking of holes injected from the p-type electrode 1512 and escaping to the n-type GaAs substrate 1501.

Thus, the laser diode 1800 of the present embodiment is also effective for increasing the efficiency of carrier recombination taking place in the active layer 1802.

[Sixteenth Embodiment]

Next, description will be made on an improved fabrication process of a group III-V semiconductor device such as a laser diode that includes therein a III-V semiconductor layer containing N as a group V element according to a sixteenth embodiment of the present invention.

In the foregoing embodiments described heretofore, the epitaxial growth of the active layer of the group III-V compound semiconductor material containing N as a group V element has been achieved by an MOCVD process that uses DMHy as the source of N. As such a III-V system containing N as a group V element includes a large immiscibility gap therein, the epitaxial growth of such a GaInNP active layer is by no means an obvious matter.

While the inventor of the present invention has previously found a successful way to grow such an epitaxial layer with controlled amount of N therein, as described in the U.S. patent application Ser. No. 08/917,141 which is incorporated herein as reference, there is still a room for improvement.

In the growth of a semiconductor layer on an underlying layer or substrate, the nucleation process on the underlying layer is generally an important factor. In the case of the epitaxial growth of a III-V mixed crystal layer that includes a large immiscibility gap therein, the nucleation process is believed to be a critical factor for the successful epitaxial growth. However, little investigations have been made so far on the nucleation process in the III-V system containing N.

During a series of experimental investigations of growing a III-V mixed crystal layer containing N as a group V element on an underlying layer, the inventor of the present invention has discovered that the exposure of the underlying III-V mixed crystal layer, which is free from N, to an atmosphere containing N is effective for improving the quality of the desired III-V mixed crystal that is grown on such an underlying III-V layer.

More specifically, the inventor of the present invention has discovered that exposure of a III-V semiconductor layer, which is free from N, to an atmosphere containing N induces an exchange of some of the atoms of the group V element on the exposed surface with N. Thereby, the mixed crystal layer of the desired III-V semiconductor material containing therein N is grown on such a processed surface of the underlying layer, without forming defects at the interface between the underlying layer and the N-containing epitaxial layer grown thereon. It should be noted that any defects existing on the surface on which an epitaxial growth of a next semiconductor layer is to be made, is inherited by the next semiconductor layer.

Figure 25:
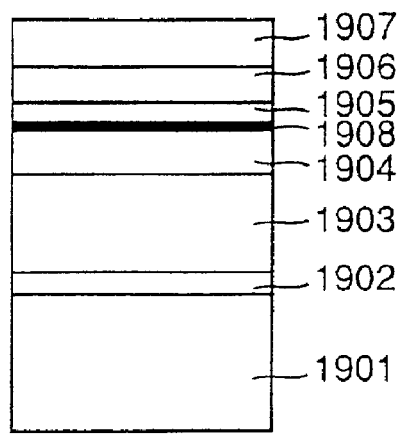
FIG. 25 is a diagram showing a layered structure according to a sixteenth embodiment of the present invention.

FIG. 25 shows the structure of a specimen 1900 used by the inventor of the present invention for the foregoing experiments. Hereinafter, the present embodiment will be described with reference to a material system that uses an active layer of GaInNAs.

Referring to FIG. 25, the specimen 1900 has a layered structure formed on an n-type GaAs substrate 1901 and includes a buffer layer 1902 of n-type GaAs formed on the substrate 1901 epitaxially, wherein the buffer layer 1902 is further covered by an epitaxial layer 1903 of n-type AlGaAs with a thickness of about 0.2 µm.

The AlGaAs layer 1903, in turn, is covered by an epitaxial layer 1904 of undoped GaAs with a thickness of about 0.1 µm, and another epitaxial layer 1905 of undoped GaInNAs is formed further on the GaAs layer 1904 with a thickness of about 7 nm. Thereby, the epitaxial layer 1905 forms a quantum well. The quantum well layer 1905 thus formed has a composition such that the quantum well layer 1905 accumulates therein a stress.

On the quantum well layer 1905, there is formed another epitaxial layer 1906 of undoped GaAs with a thickness of about 0.1 µm, and an epitaxial layer 1907 of p-type AlGaAs is formed further on the epitaxial layer 1906.

The layered structure of FIG. 25 is formed by incorporating the GaAs substrate 1901 into a deposition chamber of an MOCVD apparatus and supplying various gaseous source materials into the deposition chamber.

More specifically, the GaAs substrate 1901 is held on a susceptor provided in the deposition chamber, and the growth of the buffer layer 1902 is conducted at the substrate temperature of about 600° C. by supplying TMG and AsH$_3$ into the deposition chamber together with the carrier gas of H$_2$ as the source materials of Ga and As respectively. After the formation of the buffer layer 1902, a growth of the n-type AlGaAs layer 1903 is conducted while supplying TMA as the source of Al and Si$_2$H$_6$ as the n-type dopant, in addition to TMG and AsH$_3$, and the growth of the GaAs layer 1904 is made further on the AlGaAs layer 1903 by supplying TMG and AsH$_3$.

After the formation of the GaAs layer 1904, the supply of the source material for the group III elements such as TMG or TMA is interrupted, and the surface of the GaAs layer 1904 is exposed to an atmosphere containing DMHy in addition to AsH$_3$ while maintaining the substrate temperature to about 600° C., wherein it should be noted that DMHy is used as the source of N in the following process of growing the GaInNAs layer 1905 on the GaAs layer 1904. As a result of such an exposure to the atmosphere containing N, a part of the As atoms on the surface of the GaAs layer 1904 is replaced with N. In other words, the GaAs layer 1904 has a modified surface 1908 having a composition of GaNAs.

After such an exposure of the GaAs layer 1904 to the atmosphere containing N, the growth of the GaInNAs layer 1905 is conducted on the foregoing modified surface 1908 by supplying TMG, TMI, DMHy and AsH$_3$ respectively as the source materials of Ga, In, N and As. As noted previously, the temperature of the epitaxial growth for the GaInNAs layer 1905 is set to about 600° C., wherein it should be noted that the N content in the layer 1905 is increased when the substrate temperature is reduced or the supply rate of DMHy is increased, or the deposition rate is increased. When the deposition temperature is high, the group V elements, particularly N, escape easily from the deposited epitaxial layer. Further, it should be noted that the foregoing epitaxial growth of the GaInNAs layer 1905 is restricted by the bottle-neck process of supplying of the group III elements. Thus, whenever the supply of TMG and TMI is started, the growth of the GaInNAs layer 1905 occurs on the modified surface 1908 of the GaAs layer 1904. As the surface 1908, on which the growth of the GaInNAs layer 1905 occurs, already has the composition of GaNAs, the growth of the GaInNAs layer 1905 occurs without forming defects at the interface between the layer 1904 and layer 1905, and the GaInNAs layer 1905 is grown with substantially free from defects.

In the foregoing experiments, the process of modifying the surface 1908 of the GaAs layer 1904 was conducted by exposing the surface of the GaAs layer 1904 to the atmosphere containing N for about 30 seconds, wherein the atmosphere used for the exposure contained DMHy and AsH$_3$ with the proportion identical with the atmosphere used for growing the GaInNAs layer 1905 thereon.

Figure 26:
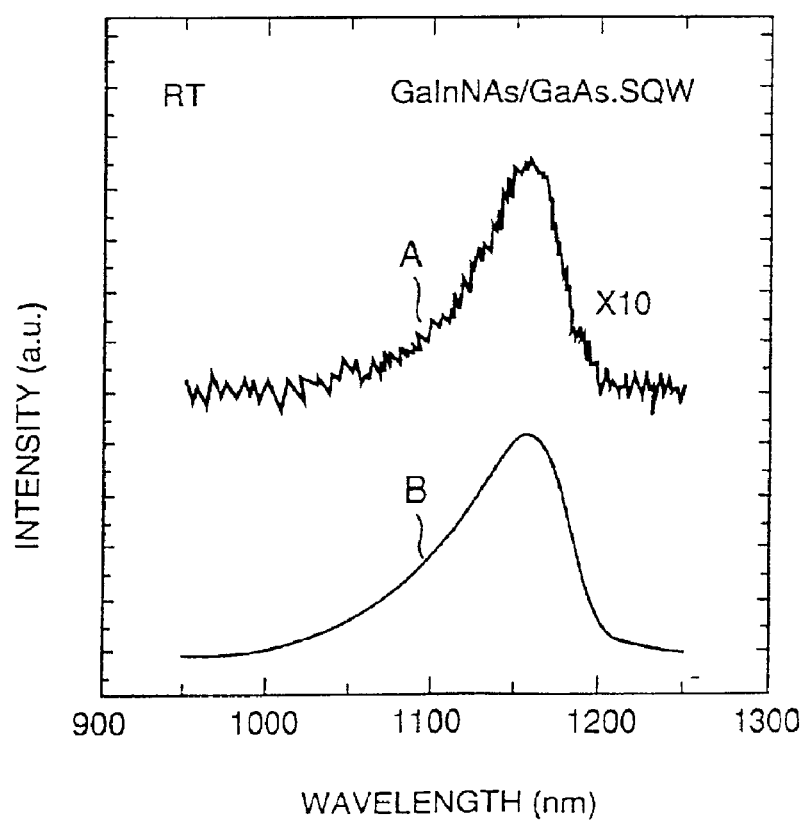
FIG. 26 is a PL spectrum observed for the layered structure of FIG. 25.

FIG. 26 shows the PL spectrum observed for the specimen of FIG. 25 (curve B) in comparison with the PL spectrum of a specimen having a similar structure except that the step of exposure to the N-containing atmosphere is omitted (curve A), wherein it should be noted that the curve A is represented with a scale ten times as large as in the case of curve B.

Referring to FIG. 26, it can be seen that the intensity of the PL spectrum is increased in the case of the curve B by the factor of about ten as compared with the case of the curve A, clearly indicating the improved quality of the GaInNP mixed crystal layer 1905 thus grown on the GaNAs surface 1908. As noted already, the result of FIG. 26 of improved crystal quality of the GaInNAs mixed crystal layer 1905 is believed to be the outcome of the improved crystal quality, including the effective suppressing of vacant site formation for the group V elements, at the foregoing interface 1908 modified to have the composition of GaNAs.

Figure 27:
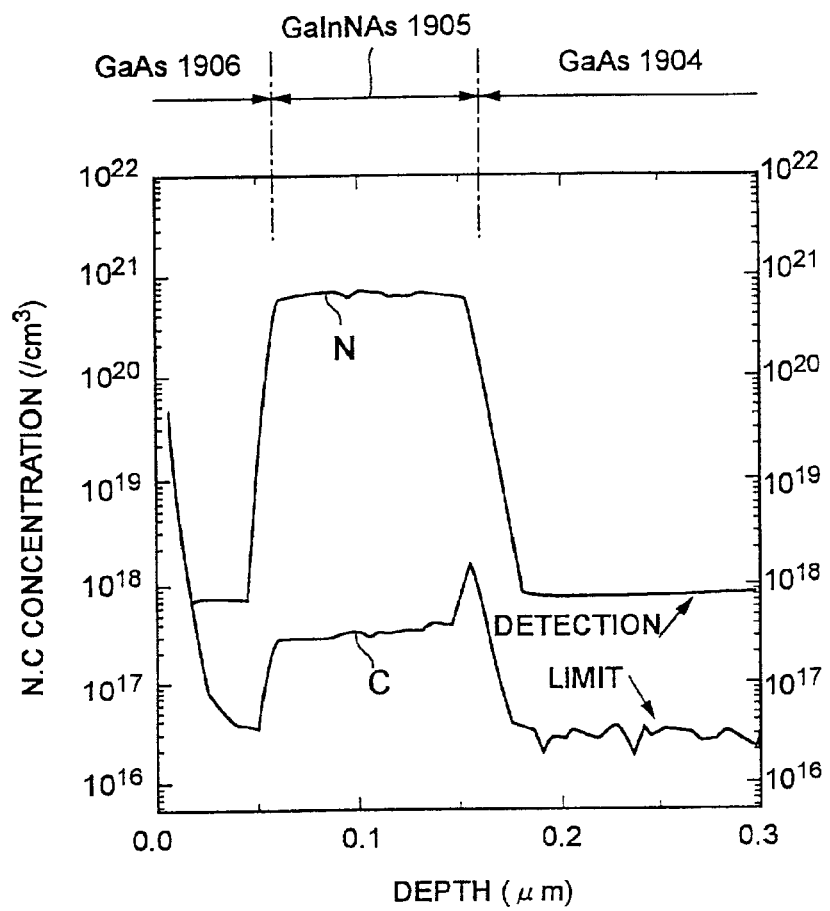
FIG. 27 is a SIMS profile observed for the layered structure of FIG. 25.

FIG. 27 shows the SIMS profile for the structure of FIG. 25 taken from the top surface of the GaAs layer 1906.

Referring to FIG. 27, it can be seen that the GaInNAs layer 1905 is more or less uniformly doped with N for substantially the entire thickness thereof. As can be seen from FIG. 27, the top part of the GaAs layer 1904 corresponding to the processed surface 1908 includes a substantial amount of N and in fact has the composition of GaNAs.

Further, the result of FIG. 27 indicates that the GaInNAs layer 1905 contains therein a substantial amount of C, while the profile of C shows that there exists a peak of C concentration in the GaInNAs layer 1905 at the bottom part thereof adjacent to the foregoing GaNAs interface 1908. It is believed that the C concentration in the GaInNAs layer 1905 arises due to the methyl group contained in DMHy used for the source of N in the growth of the GaInNP layer 1905. The result of FIG. 27 suggests that such an incorporation of C into the III-V layer occurs inevitably when a part of the group V elements is replaced with N in the epitaxial growth process of the III-V layer.

It should be noted that the foregoing exposure process of the GaAs layer 1904 is not limited to 30 seconds but can be set to any arbitrary duration as long as a clear PL intensity is obtained.

[Seventeenth Embodiment]

Figure 28:
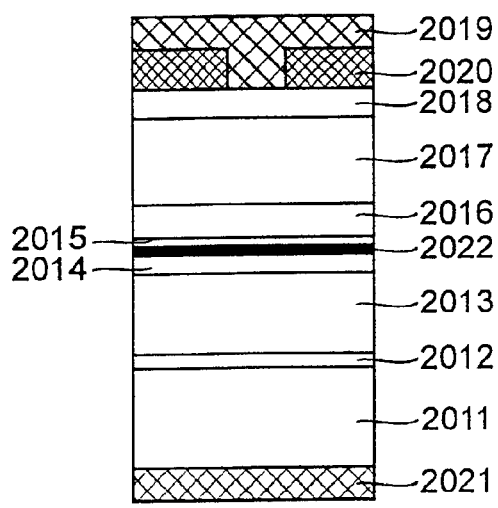
FIG. 28 is a diagram showing the construction of a laser diode according to a seventeenth embodiment of the present invention.

FIG. 28 shows the construction of an SQW laser diode 2000 having an SCH structure according to a seventeenth embodiment of the present invention.

Referring to FIG. 28, the laser diode 2000 is constructed on a GaAs substrate 2011 and includes a buffer layer 2012 of the n-type grown epitaxially on the GaAs substrate 2011, wherein the buffer layer 2012 carries thereon a lower cladding layer 2013 of n-type AlGaAs grown epitaxially on the buffer layer 2012 with a composition of $Al_{0.4}Ga_{0.6}As$ and with a thickness of 1.5 μm, and a lower optical waveguide layer 2014 of undoped GaAs is formed further on the lower cladding layer 2014 epitaxially with a thickness of about 120 nm.

It should be noted that the epitaxial layers 2012–2014 are grown on the GaAs substrate 2011 consecutively by an MOCVD process while supplying TMG and/or TMA as the source of Ga and Al together with $AsH_3$ as a source of As, wherein the surface of the optical waveguide layer 2014 thus formed is processed by exposing to an atmosphere that contains $AsH_3$ and DMHy while maintaining the substrate temperature of about 600° C. for about 60 seconds. During this exposure process, the supply of the group III elements is suppressed and there occurs no substantial growth of the III-V crystal layer on the optical waveguide layer 2014. As a result of such an exposure to the atmosphere containing N and As, a part of the atoms on the surface of the layer 2014 is replaced with N as demonstrated in the SIMS profile of FIG. 27 and there is formed a thin layer 2022 of GaNAs on the surface of the optical waveguide layer 2014. As the atmosphere contains also $AsH_3$, such an exposure process does not induce formation of vacant site for the group V element in the layer 2022, and the layer 2022 provides an excellent surface for further epitaxial growth of a III-V semiconductor layer thereon.

After such a processing of the surface of the GaAs optical waveguide layer 2014 to form the GaNAs layer 2022, an epitaxial growth of an active layer 2015 of undoped GaInNAs layer 2015 is conducted on the layer 2022 by an MOCVD process that uses TMG and TMI for the source materials of Ga and In and $AsH_3$ and DMHy as the source materials of As and N. Typically, the active layer 2015 is formed with a composition of $Ga_{0.8}In_{0.2}N_{0.02}As_{0.98}$ and has a thickness of about 10 nm. Thereby, the active layer forms a quantum well characterized by quantum levels formed therein for electrons and holes. It should be noted that the active layer 2015 having such a composition accumulates therein a compressive strain of about 1%. Thereby, there is formed a type-I heterojunction at the interface between the GaInNAs active layer 2015 and the underlying GaAs optical waveguide layer 2014.

On the active layer 2015 thus formed, there is formed an upper optical waveguide layer 2016 of undoped GaAs epitaxially with a thickness of about 120 nm, and an upper cladding layer of p-type AlGaAs having a composition of $Al_{0.4}Ga_{0.6}As$ is formed further on the upper optical waveguide layer 2016 epitaxially with a thickness of about 1.6 μm.

On the upper cladding layer 2017, there is formed a contact layer 2018 of p-type GaAs epitaxially with a thickness of about 0.3 μm, and an insulating film 2020 of $SiO_2$ is formed on the contact layer 2018. The contact layer 2018 is formed with a stripe opening extending in the longitudinal direction of the laser diode, and a p-type electrode 2019 is formed on the insulating film 2020 in ohmic contact with the GaAs contact layer 2018 at the stripe opening in the insulating film 2020. Further, an n-type electrode 2021 is provided on the bottom surface of the substrate 2011 in ohmic contact therewith.

In the laser diode 2000 of FIG. 28, it should be noted that the active layer 2015 of GaInNAs forming the SQW structure has an excellent quality for the crystal and the optical loss caused by non-optical recombination of the carriers is minimized. As a result of use the active layer 2015 of GaInNAs containing N therein, a large band discontinuity is guaranteed in the conduction band at the heterojunction interface to the underlying GaAs optical waveguide layer 2014 or the overlaying GaAs optical waveguide layer 2016, there occurs an effective confinement of electrons in the active layer 2015 and the preferable feature of high efficiency of laser oscillation is maintained even when the laser diode 2000 is operated in the room temperature environment. The laser diode 2000 of the present embodiment produces an optical beam with the optical wavelength band of 1.3 μm.

In the present embodiment, it should be noted that the deposition process of the epitaxial layers 2012–2018 is by no means limited to the MOCVD process described but an MBE process may be used similarly. Further, the active layer 2015 is by no means limited to have the SQW structure but may have an MQW structure.

[Eighteenth Embodiment]

Figure 29:
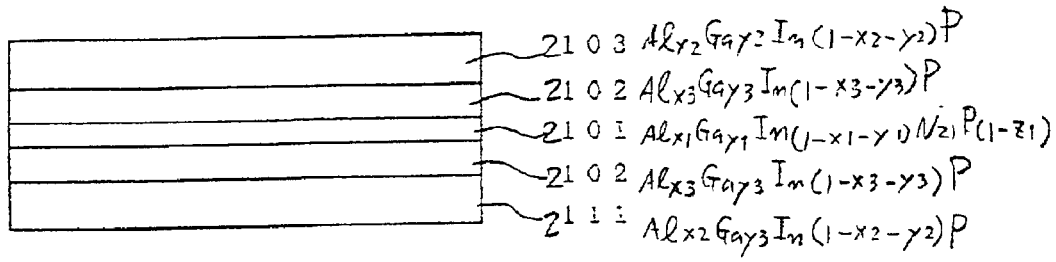
FIG. 29 is a diagram showing the construction of a semiconductor layered structure according to an eighteenth embodiment of the present invention.

FIG. 29 shows a semiconductor layered structure according to an eighteenth embodiment.

As explained with reference to FIG. 10, there occurs a remarkable concentration or segregation of N when a GaInP layer is grown epitaxially on an underlying AlGaInP layer by an MOCVD process, indicating that there exists a strong interaction between Al in the AlGaInP layer and N that is supplied to the surface of the AlGaInP layer together with other source elements of the GaInP layer.

The result of FIG. 10 thus indicates that the content of N to be incorporated into the III-V epitaxial layer can be increased significantly when Al is incorporated into the III-V epitaxial layer as the group III element. Due to the increased content of N, the degree of freedom for designing the band structure of the III-V epitaxial layer is increased substantially, and various band structures that have not been realized hitherto may be obtained.

Referring to FIG. 29, it can be seen that there is provided an epitaxial layer 2111 of AlGaInP, on which an epitaxial layer 2102 of AlGaInP and an epitaxial layer 2101 of AlGaInNP are deposited epitaxially and consecutively, wherein the epitaxial layer 2101 has a composition represented by the compositional parameters x1, y1 and z1 as $Al_{x1}Ga_{y1}In_{(1-x1-y1)}N_{z1}P_{(1-z1)}$, the epitaxial layer 2111 has a composition represented by the compositional parameters x2 and y2 as $Al_{x2}Ga_{y2}In_{(1-x2-y2)}P$, and the epitaxial layer 2102 has a composition represented by the compositional parameters x3 and y3 as $Al_{x3}Ga_{y3}In_{(1-x3-y3)}P$, in which the compositional parameters are set so as to satisfy the relationship $0 \leq x1 < 1$, $0 \leq x3 < x2$, $0 < y1 \leq 1$, $0 \leq y2 < 1$, $0 < y3 \leq 1$, and $0 < z1 < 1$.

Further, the epitaxial layer 2102 is provided on the epitaxial layer 2101, and an epitaxial layer 2103 having a composition identical with that of the epitaxial layer 2111 is provided on the epitaxial layer 2101.

In the construction of FIG. 29, the energy level of both of the conduction band and valence band is decreased in the AlGaInNP epitaxial layer 2101 as a result of incorporation of N as explained before. Thereby, it should be noted that the amount of N to be incorporated in the epitaxial layer 2101 is increased significantly due to the presence of Al in the epitaxial layer 2101, and the degree of freedom of band structure designing is increased substantially. Further, in view of the improved efficiency of incorporating N into the epitaxial layer 2101, only a small amount of N source is used for causing a substantial modification of the band structure of the layer 2101. Thereby, the cost of forming the semiconductor layered structure of FIG. 29 is reduced also.

As noted already with reference to FIG. 10, the existence of Al in the layer underlying the layer that contains N causes a severe deterioration in the quality of the N-containing layer grown thereon due to the segregation of N at the interface between the N-containing layer and the underlying layer. Thus, in the structure of FIG. 29, the Al content x3 of the layer 2102 underlying the AlGaInNP layer 2101 is reduced substantially as compared with the Al content x2 of the epitaxial layer 2111 further underlying the layer 2102. The Al content x3 of the layer 2102 may be zero as well. Thereby, the segregation of N at the interface between the AlGaInNP layer 2101 and the underlying layer 2102 is successfully suppressed and the AlGaInNP layer 2101 can be grown with an excellent quality. Further, by interposing such an intermediate layer 2102 between the epitaxial layer 2111 of AlGaInP and the AlGaInNP layer 2101, it becomes possible to increase the Al content x2 without problem. By increasing the Al content x2, the bandgap of the layer 2111 is increased substantially. It should be noted that the intermediate layer 2102 may have small thickness just enough for covering the surface of the layer 2111.

Figure 30:
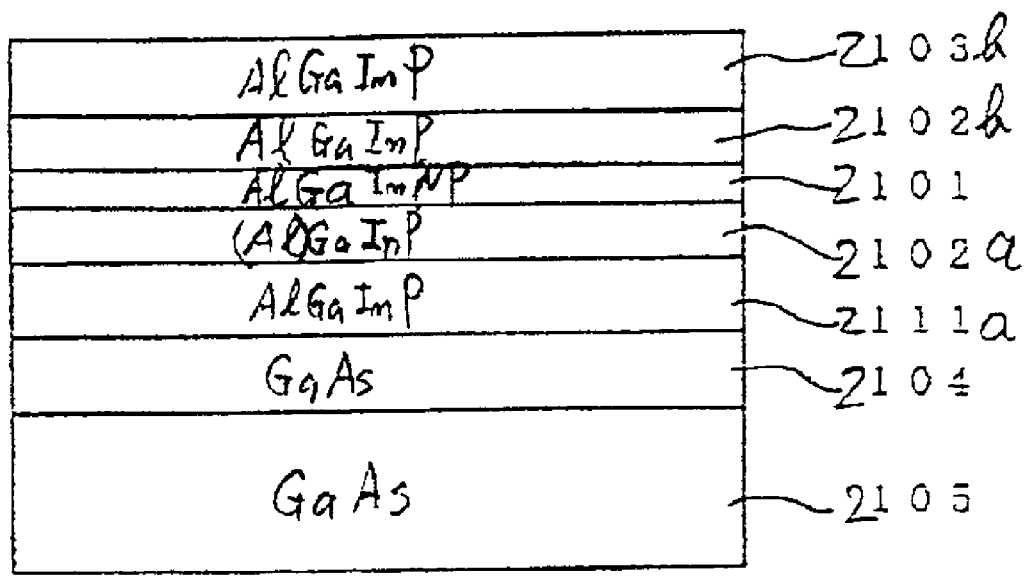
FIG. 30 is a diagram showing the construction of the semiconductor layered structure of FIG. 29 as applied to a light-emitting semiconductor device.

FIG. 30 shows the layered structure of FIG. 29 in more detail, wherein FIG. 30 shows the layered structure as applied to a light-emitting device.

Referring to FIG. 30, the layered structure of FIG. 29 is constructed on a GaAs substrate 2105 covered by a buffer layer 2104 of GaAs, wherein an AlGaInP layer 2111a having a thickness of 0.1 $\mu$m and a composition of $(Al_{0.5}Ga_{0.5})_{0.5}In_{0.5}P$ is formed epitaxially on the buffer layer 2104 in correspondence to the layer 2111 of FIG. 29 as a lower cladding layer, an intermediate layer 2102a of AlGaInP having a thickness of 4 nm and a composition of $(Al_{0.1}Ga_{0.9})_{0.5}In_{0.5}P$ is formed epitaxially on the AlGaInP layer 2111a in correspondence to the layer 2102 of FIG. 29, and the AlGaInNP layer 2101 having a thickness of 30 nm and a composition of $(Al_{0.2}Ga_{0.8})_{0.5}In_{0.5}N_{0.002}P_{0.998}$ is formed on the intermediate layer 2102a in correspondence to the AlGaInNP layer 2101 of FIG. 29. On the AlGaInNP layer 2101, there is formed an AlGaInP intermediate layer 2102b substantially identically with the intermediate layer 2102a, and an AlGaInP layer 2103b is formed further on the AlGaInP intermediate layer 2102b similarly to the intermediate layer 2103a as an upper cladding layer.

In the structure of FIG. 30, a semi-insulating GaAs single-crystal having a surface inclined with respect to the (100) surface in the <011> direction with an angle of about 15° is used for the GaAs substrate 2105. The structure of FIG. 30 is typically formed by an MOCVD process while using TMG for the metal organic source of Ga, TMA for the metal organic source of Al, TMI for the metal organic source of In, $PH_3$ as the gaseous source of P, and DMHy as the organic source of N, together with a carrier gas of $H_2$, wherein the deposition of the epitaxial layers is typically conducted at a temperature of about 750° C., which is substantially higher than the conventional temperature used for growing an N-containing III-V layer of about 650° C. In the foregoing growth process, it is also possible to use MMHy (monomethylhydradine) for the organic source of N.

Figure 31:
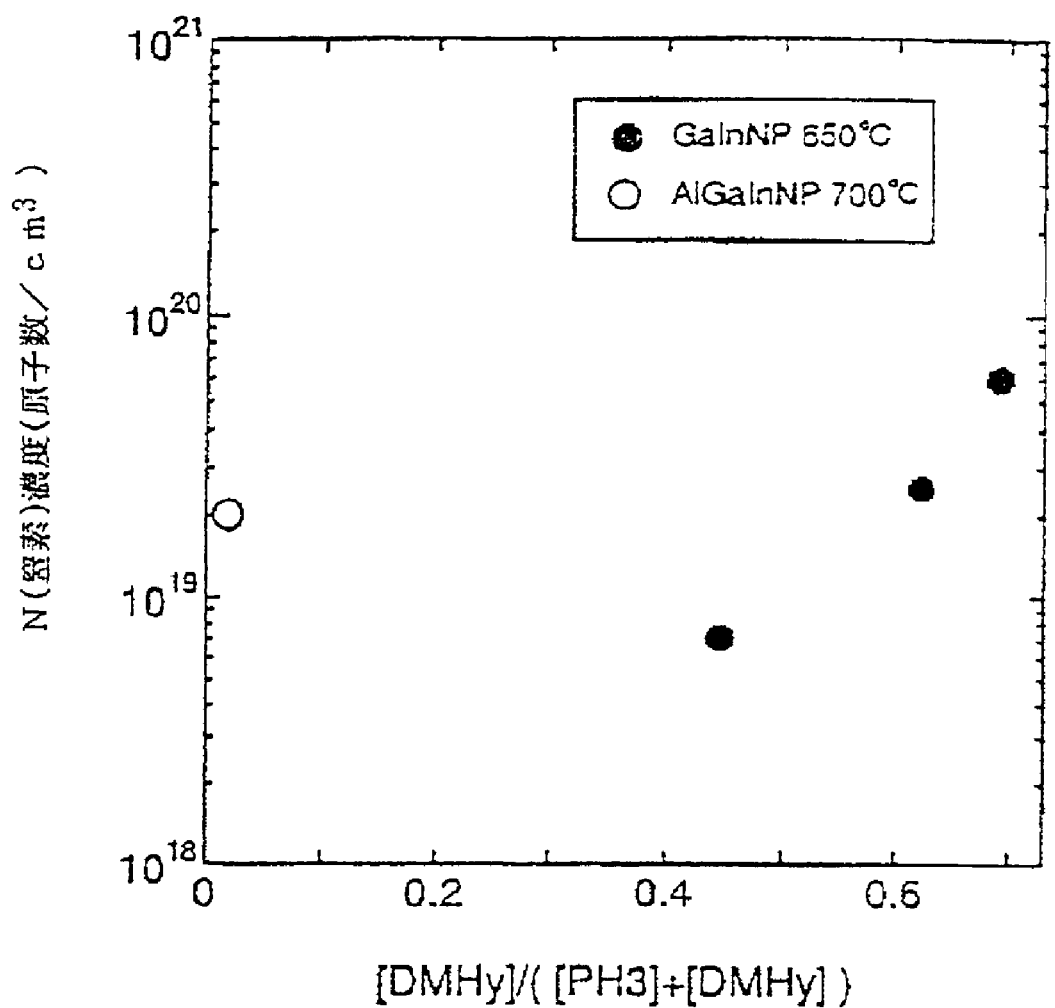
FIG. 31 is a diagram showing the effect of Al on the incorporation of N into a III-V semiconductor layer.

FIG. 31 compares the amount of N incorporated into an AlGaInP epitaxial layer having a composition of $(Al_{0.2}Ga_{0.8})_{0.5}In_{0.5}P$ in comparison with the case of a GaInP epitaxial layer having a composition of $Ga_{0.5}In_{0.5}P$.

Referring to FIG. 31, it can be seen that the amount of N incorporated into the GaInP epitaxial layer increases with increasing mole ratio of DMHy with respect to $PH_3$ defined as $[DMHy]/([PH_3]+[DMHy])$. Further, there is a tendency that the amount of N thus incorporated increases with decreasing deposition temperature of the GaInP epitaxial layer.

On the other hand, FIG. 31 also represents a remarkable result in that, when Al is contained in the epitaxial layer, the amount of N thus incorporated increases sharply even in the case the mole ratio of DMHy is as low as about 1%. This result is in good agreement with the result of FIG. 10 indicating the segregation of N at the interface between the AlGaInP layer and the GaInNP layer grown thereon.

In the structure of FIG. 31, it should be noted that the quality of the AlGaInNP epitaxial layer 2101 would be deteriorated substantially when the intermediate layer 2102a is omitted, because of extensive formation of rough surface. However, this problem is successfully avoided by interposing the intermediate layer 2102a with a reduced or zero Al-content, and the AlGaInNP epitaxial layer 2101 thus grown on the intermediate layer 2102a shows a mirror flat top surface. As noted already, the thickness of the intermediate layer 2102a can be very small such as 4 nm as noted above, as long as the intermediate layer 2102a covers the top surface of the underlying AlGaInP cladding layer 2111a uniformly.

The light-emitting device of FIG. 30 is driven by injecting electrons and holes into the AlGaInNP active layer 2101a respectively from the lower cladding layer 2111a and the upper cladding layer 2103b and shows a PL wavelength offset in the longer wavelength direction due to the incorporation of N in the active layer 2101a. Because of the mirror flat surface achieved for the intermediate layer 2102a and the active layer 2101a, the light-emitting device of FIG. 30 achieves a high efficiency of light emission.

Further, because of the large band discontinuity in the conduction band at the interface between the active layer and the adjacent intermediate layer 2102a or 2102b and thus the adjacent cladding layer 2111a or 2103b, the overflowing of carriers from the active layer 2101 is effectively minimized and the efficiency of light emission is improved substantially, similarly to the previous embodiments due to the incorporation of N into the active layer 2101.

Further, the light-emitting device of FIG. 30 can decrease the optical wavelength while simultaneously maintaining the large band discontinuity, by incorporating Al and N simultaneously into the active layer 2101. It should be noted that N causes a downward shifting of the conduction band energy and valence band energy and further the decrease of the bandgap energy, while Al compensates for the decrease of the bandgap energy. Thereby, the light-emitting device of FIG. 30 produces a short wavelength optical beam with a high efficiency of emission.

It should be noted that the structure of FIG. 29 or 30 can be formed also by an MBE process. Further, the source of N is not limited to DMHy but other N-containing compounds such as $NH_3$ may also be used.

[Nineteenth Embodiment]

Figure 32:
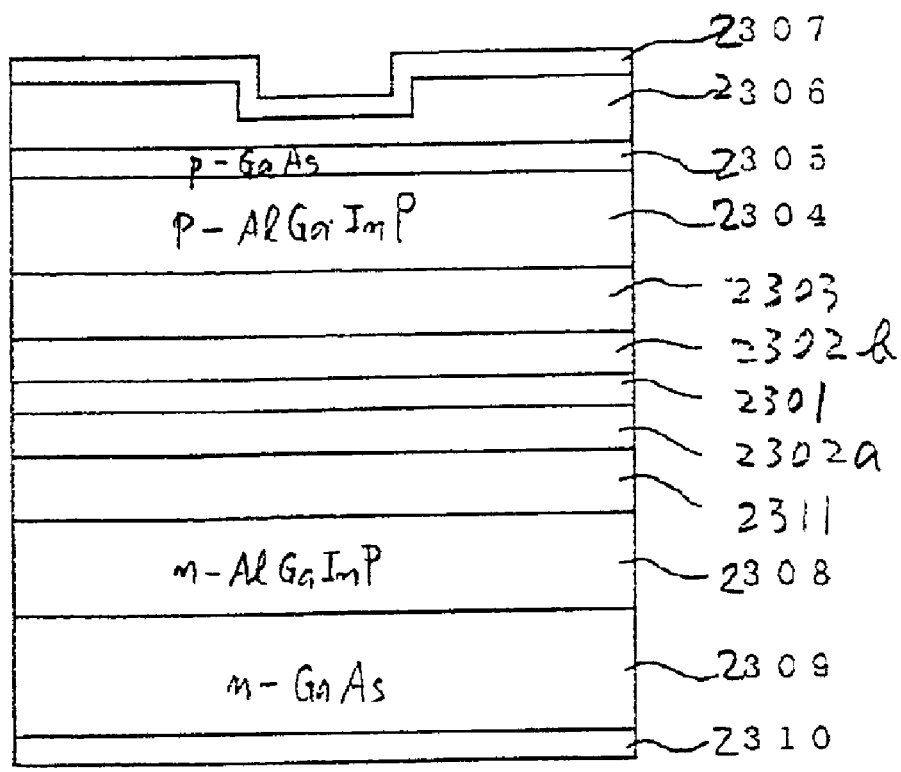
FIG. 32 is a diagram showing the construction of a laser diode according to a nineteenth embodiment of the present invention.

FIG. 32 shows the construction of an edge-emission-type stripe laser diode according to a nineteenth embodiment of the present invention in a cross-sectional view as viewed in an axial direction.

Referring to FIG. 32, the laser diode is constructed on a substrate 2310 of n-type GaAs having an inclined surface similar to the one described with reference to FIG. 29, and includes a lower cladding layer 2308 of n-type AlGaInP having a thickness of 1 $\mu$m and a composition of $(Al_{0.7}Ga_{0.3})_{0.5}In_{0.5}P$ formed on the GaAs substrate 2310, a lower optical waveguide layer of undoped AlGaInP having a thickness of 0.1 μm and a composition of $(Al_{0.5}Ga_{0.5})_{0.5}In_{0.5}P$ formed on the lower cladding layer 2308, and a lower intermediate layer 2302a of undoped AlGaInP having a thickness of 4 nm and a composition of $(Al_{0.1}Ga_{0.9})_{0.5}In_{0.5}P$ formed on the lower optical waveguide layer 2311, and an active layer 2301 of undoped AlGaInNP having a composition of $(Al_{0.2}Ga_{0.8})_{0.5}In_{0.5}N_{0.002}P_{0.998}$ is formed on the lower intermediate layer 2302a with a thickness of about 30 nm.

Further, on the active layer 2301, there is formed an upper intermediate layer 2302b of undoped AlGaInP with composition and thickness similar to those of the lower intermediate layer 2302a, and an upper optical waveguide layer 2303 of undoped AlGaInP is formed further on the upper intermediate layer 2302b with thickness and composition similar to those of the lower optical waveguide layer 2311. On the upper optical waveguide layer 2303, there is formed an upper cladding layer 2304 of p-type AlGaInP with composition and thickness similar to those of the lower cladding layer 2308 except for the conductivity type, and a contact layer 2305 of p-type GaAs is formed further on the upper cladding layer 2304.

The GaAs contact layer 2305 is covered with an $SiO_2$ film 2306 having a contact window exposing the contact layer 2306, and a p-type electrode 2307 is provided on the $SiO_2$ film 2306 in contact with the contact layer 2306 at the contact window. Further, an n-type electrode 2310 is provided on the bottom surface of the substrate 2309.

In the structure of FIG. 32, it should be noted that the optical waveguide layer 2311 corresponds to the epitaxial layer 2111 of FIG. 29, the intermediate layer 2302a corresponds to the epitaxial layer 2102 of FIG. 29, the active layer 2101 corresponds to the epitaxial layer 2101 of FIG. 29, the intermediate layer 2102 corresponds to the epitaxial layer 2102 of FIG. 29, and the optical waveguide layer 2303 corresponds to the epitaxial layer 2103 of FIG. 29.

The laser diode of FIG. 32 has an advantageous feature of effective electron confinement in the active layer 2301 and simultaneously an advantageous feature of increased bandgap energy for emitting a short wavelength laser beam as a result of simultaneous incorporation of Al and N into the active layer 2301.

[Twentieth Embodiment]

Figure 33:
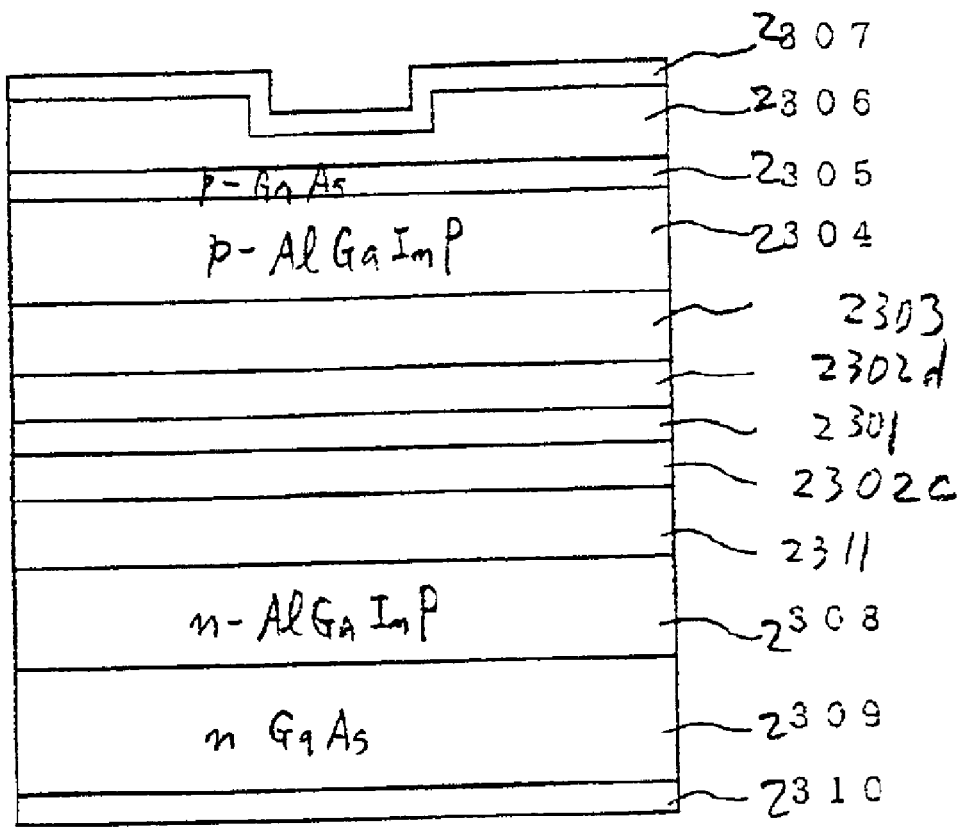
FIG. 33 is a diagram showing the construction of a laser diode according to a twentieth embodiment of the present invention.

FIG. 33 shows the construction of an edge-emission-type stripe laser diode according to a twentieth embodiment of the present invention in an axial cross-sectional view, wherein those parts corresponding to the parts described previously are designated by the same reference numerals and the description thereof will be omitted.

Referring to FIG. 33, the laser diode of the present embodiment has a construction similar to that of FIG. 32, except that undoped InGaP layers 2302c and 2302d having a composition of $Ga_{0.65}In_{0.35}P$ are used in place of the AlGaInP intermediate layers 2302a and 2302b. By using the composition entirely free from Al for the intermediate layers 2302c and 2302d, the quality of the N-containing active layer 2301 is improved and the efficiency of laser oscillation is also improved.

While the present embodiment is explained with reference to a material system that uses GaInNP for the active layer, it should be noted that a similar result is obtained also for other systems that uses other N-containing III-V material such as GaInNAs for the active layer. In this case, a photon emission in the optical wavelength band of 1.3 μm becomes possible.

Further, the present invention is not limited to those embodiments described heretofore, but various variations and modifications may be made without departing from the scope of the invention.

What is claimed is:

1. A method of fabricating a compound semiconductor device, comprising the steps of:
    (a) forming a first group III-V compound semiconductor layer not containing N epitaxially on a substrate;
    (b) exposing a surface of said first group III-V compound semiconductor layer to an atmosphere containing N;
    (c) forming, after said step (b), a second group III-V compound semiconductor layer on said first group III-V compound semiconductor layer epitaxially, said second group III-V compound semiconductor layer containing therein N as a group V element,
    wherein said atmosphere is substantially free from a group III element.

2. A method as claimed in claim 1, wherein said atmosphere contains an organic nitrogen compound and a source gas of a group V element other than N.

3. A method as claimed in claim 1, wherein said atmosphere contains DMHy.

4. A method as claimed in claim 3, wherein said step of exposing is conducted at a temperature of about 600° C.

5. A method of fabricating a semiconductor layered structure comprising a first epitaxial layer of AlGaInNP having a composition represented by compositional parameters x1, y1 and z1 as $Al_{x1}Ga_{y1}In_{(1-x1-y1)}N_{z1}P_{(1-z1)}$ (0<x1<1, 0<y1≦1, 0<z1<1), a pair of second epitaxial layers of AlGaInP having a composition represented by compositional parameters x2 and y2 as $Al_{x2}Ga_{y2}In_{(1-x2-y2)}P$, each said second epitaxial layer being disposed adjacent to and respectively on either side of said first epitaxial layer, and a pair of third epitaxial layers of AlGaInP having a composition represented by compositional parameters x3 and y3 as $Al_{x3}Ga_{y3}In_{(1-x3-y3)}P$, each said third epitaxial layer being disposed respectively between said first and second epitaxial layers, said first through third epitaxial layers maintaining an epitaxy with each other, said compositional parameters being set so as to satisfy the relationship 0≦x3≦x1<x2≦1; 0<y3≦1, said method comprising the steps of:
    forming said second epitaxial layers by using a metal organic compound of Al for the source of Al;
    forming said first epitaxial layer by using a metal organic compound of Al for the source of Al; and
    forming said third epitaxial layers by using a metal organic compound of Al for the source of Al.

6. A method as claimed in claim 5, wherein said step of forming said first epitaxial layer is conducted further by using an organic compound of N as the source of N.

7. A method as claimed in claim 6, wherein said organic compound is selected from one of dimethylhydradine and monomethylhydradine.

8. A method of fabricating a compound semiconductor device, comprising the steps of:
    (a) forming a first group III-V compound semiconductor layer not containing N epitaxially on a substrate;
    (b) introducing nitrogen into a surface of the first group III-V compound semiconductor layer by exposing said surface of said first group III-V compound semiconductor layer to an atmosphere containing N and substantially free from a group III element; and
    (c) forming, after said step (b), a second group III-V compound semiconductor layer on said first group III-V compound semiconductor layer epitaxially, said second group III-V compound semiconductor layer containing therein N as a group V element.

9. A method as claimed in claim 8, wherein said atmosphere contains an organic nitrogen compound and a source gas of a group V element other than N.

10. A method as claimed in claim 9, wherein said atmosphere contains DMHy.

11. A method as claimed in claim 10, wherein said step of introducing is conducted at a temperature of about 600° C.

* * * * *